(12) United States Patent
Yoshihara et al.

(10) Patent No.: US 9,307,653 B2
(45) Date of Patent: Apr. 5, 2016

(54) SUBSTRATE CLEANING METHOD, SUBSTRATE CLEANING APPARATUS AND STORAGE MEDIUM FOR CLEANING SUBSTRATE

(71) Applicant: Tokyo Electron Limited, Tokyo (JP)

(72) Inventors: Kousuke Yoshihara, Koshi (JP); Keiichi Tanaka, Koshi (JP); Hiroshi Ichinomiya, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 458 days.

(21) Appl. No.: 13/733,370

(22) Filed: Jan. 3, 2013

(65) Prior Publication Data

US 2013/0174873 A1      Jul. 11, 2013

(30) Foreign Application Priority Data

Jan. 5, 2012   (JP) ................................. 2012-000562

(51) Int. Cl.
| | |
|---|---|
| *B08B 5/02* | (2006.01) |
| *H05K 3/26* | (2006.01) |
| *B08B 3/02* | (2006.01) |
| *H01L 21/67* | (2006.01) |

(52) U.S. Cl.
CPC ........ *H05K 3/26* (2013.01); *B08B 3/024* (2013.01); *B08B 5/02* (2013.01); *H01L 21/67028* (2013.01); *H01L 21/67034* (2013.01); *H05K 2203/1509* (2013.01)

(58) Field of Classification Search
CPC .......... B08B 5/05; B08B 7/00; B08B 3/0242; H01L 21/67028; H01L 21/67034; H01L 21/67051
USPC ........ 134/19, 21, 26, 31, 32, 33, 36, 37, 94.1, 134/95.2, 95.3, 135, 153, 902
See application file for complete search history.

(56) References Cited

U.S. PATENT DOCUMENTS

| | | | |
|---|---|---|---|
| 6,247,479 B1 * | 6/2001 | Taniyama et al. ............. 134/95.2 |
| 2008/0105653 A1 * | 5/2008 | Seah et al. ........................ 216/92 |
| 2009/0202951 A1 * | 8/2009 | Yamamoto et al. ............ 430/322 |
| 2012/0164840 A1 * | 6/2012 | Tanaka et al. .................. 438/745 |

FOREIGN PATENT DOCUMENTS

| | | |
|---|---|---|
| JP | 11-186123 A | 7/1999 |
| JP | 2004-335542 A | 11/2004 |
| JP | 2009-071028 A | 4/2009 |
| JP | 2009-252855 A | 10/2009 |

* cited by examiner

*Primary Examiner* — Saeed T Chaudhry
(74) *Attorney, Agent, or Firm* — Pearne & Gordon LLP

(57) ABSTRACT

A substrate cleaning method is capable of preventing a liquid stream on a substrate from being cut and circuit patterns thereon from being damaged. The substrate cleaning method includes a liquid film forming process that forms a liquid film on an entire substrate surface by supplying a cleaning liquid L from a central portion of the substrate W toward a peripheral portion thereof while rotating the substrate; a drying region forming process that discharges a gas G on the substrate surface and removes the cleaning liquid on the substrate surface; and a residual liquid removing process that removes the cleaning liquid remaining between the circuit patterns by discharging a gas G while moving in a diametrical direction of the substrate.

18 Claims, 28 Drawing Sheets

(a)

(b)

(a)

(b)

(c)

50: DEVELOPING LIQUID NOZZLE
60: CLEANING LIQUID NOZZLE
63: CLEANING LIQUID SUPPLY SOURCE
70A: COMMON GAS NOZZLE
90: CONTROL COMPUTER
100: SUBSTRATE CLEANING APPARATUS (a)

(b)

(a)

(b)

(c)

(a)

(b)

SUBSTRATE CLEANING METHOD, SUBSTRATE CLEANING APPARATUS AND STORAGE MEDIUM FOR CLEANING SUBSTRATE

CROSS-REFERENCE TO RELATED APPLICATION

This application claims the benefit of Japanese Patent Application No. 2012-000562 filed on Jan. 5, 2012, the entire disclosures of which are incorporated herein by reference.

FIELD OF THE INVENTION

The present disclosure relates to a substrate cleaning method and a substrate cleaning apparatus for cleaning a substrate by supplying a cleaning liquid onto the substrate having thereon a circuit pattern, and also relates to a storage medium for cleaning the substrate.

BACKGROUND OF THE INVENTION

In a semiconductor manufacturing process, a circuit pattern is formed through a series of processes of coating a photoresist film on a substrate such as a semiconductor wafer, exposing the photoresist film to light with a preset circuit pattern and developing the photoresist film. This process is called a photolithography process. In the photolithography process, a processing system in which an exposure apparatus is connected to a coating and developing apparatus is typically used.

In the photolithography process, a developing liquid is supplied on the substrate, and a soluble portion of the photoresist film is dissolved by this developing liquid, so that the required circuit pattern is formed. Thereafter, generally, a cleaning process is performed in order to remove the dissolved products and the developing liquid from a surface of the substrate.

Conventionally, a spin cleaning method is known for such a cleaning process. In this spin cleaning method, as shown in FIG. 28(a), a cleaning liquid L is supplied onto a central portion of a substrate (hereinafter, referred to as "wafer W"). Then, the wafer W is rotated about a vertical axis thereof, and a liquid film of the cleaning liquid L is formed by a centrifugal force. The dissolved products and the developing liquid are removed from the substrate by being washed away by a flow of the cleaning liquid L.

Further, as another cleaning method, there is known a substrate cleaning method and a substrate cleaning apparatus as illustrated in FIG. 29(a). In the substrate cleaning method and substrate cleaning apparatus, the wafer W is rotated about a vertical axis thereof while being held horizontally, and a cleaning liquid L is discharged to a central portion of the wafer W from a cleaning liquid nozzle 60 and diffused to the entire surface of the wafer W by the centrifugal force. Then, by discharging a gas G toward the central portion of the wafer W from a gas nozzle 70, a drying region is formed on the wafer W. Then, by moving the cleaning liquid nozzle 60 outward, the drying region is diffused to a peripheral portion of the wafer W. As a result, the wafer W is cleaned (see, for example, Patent Document 1).

Patent Document 1: Japanese Patent Laid-open Publication No. 2009-252855 (Claims)

In the conventional spin cleaning method, however, an effect of removing the dissolved products has been low, and it has taken a long time to complete a spin cleaning process. Further, recently, as for the wafer W on which minute circuit patterns P having a high aspect ratio are formed, dissolved products remaining between the circuit patterns P may not be cleaned sufficiently even if the conventional spin cleaning process is performed for a long time. That is, as for the wafer W having the circuit patterns P of the high aspect ratio, in the cleaning process after the developing process, the liquid film of the cleaning liquid L is moved on the wafer W toward the peripheral portion thereof by the centrifugal force generated by the rotation of the wafer W for a short time. Accordingly, the dissolved products between the circuit patterns may not be sufficiently removed by the cleaning liquid L. Further, if the supply of the cleaning liquid L is stopped, a stream of the cleaning liquid L may be cut at the peripheral portion of the wafer W where the centrifugal force is especially great, as illustrated in FIG. 28(b), so that the dissolved products and the cleaning liquid L may remain between the circuit patterns.

Moreover, even if the stream of the cleaning liquid L is prevented from being cut, the cleaning liquid L containing the dissolved products may remain between the circuit patterns, as depicted in FIG. 28(c).

As shown in FIG. 28(c), if surface tension of the cleaning liquid L between the circuit patterns becomes great, pattern damage may occur by the stress balance between the circuit patterns. Furthermore, if a rotation number of the wafer W is increased excessively, the circuit patterns may not stand against the stress generated by the rotation, resulting in the pattern damage. As a consequence, a development defect may be caused.

Meanwhile, it is described in Patent Document 1 that the cleaning liquid L is supplied to the central portion of the wafer W, and after forming the drying region by discharging the gas G to the central portion of the wafer W, the cleaning liquid nozzle 60 is moved at a speed lower than a speed at which the drying region is diffused outward, in order to prevent the stream of the cleaning liquid L from being cut. According to this substrate cleaning method, by moving the cleaning liquid nozzle 60 and the gas nozzle 70 from the central portion of the surface of the wafer W toward the peripheral portion thereof, the liquid film of the cleaning liquid L can be removed by the gas G discharged from the gas nozzle 70. Accordingly, the stream of the cleaning liquid L can be prevented from being cut. Even if the technique described in Patent Document 1 is used, however, it may be still difficult to remove the cleaning liquid L remaining between the circuit patterns having the high aspect ratio.

With the technique described in Patent Document 1, it may be possible to reduce a residual amount of the cleaning liquid L between the circuit patterns by decreasing the moving speed of the gas nozzle 70. After the gas nozzle 70 passes away, however, the centrifugal force would be applied to the circuit patterns P for a long time while the cleaning liquid L still remains between the circuit patterns P. As a result, the circuit patterns P may be damaged (see FIG. 29(b)).

BRIEF SUMMARY OF THE INVENTION

In view of the foregoing problems, illustrative embodiments provide a substrate cleaning method and a substrate cleaning apparatus capable of preventing a liquid stream from being cut and preventing a circuit pattern from being damaged in a cleaning process performed after a substrate developing process in which a minute circuit pattern having a high aspect ratio is formed. The illustrative embodiments also provide a storage medium for using in such substrate cleaning process.

In accordance with one aspect of an illustrative embodiment, there is provided a substrate cleaning method for cleaning a surface of a substrate on which circuit patterns are formed. The substrate cleaning method includes a liquid film forming process that forms a liquid film on an entire surface of the substrate by supplying a cleaning liquid from a central portion of the substrate toward a peripheral portion thereof while horizontally holding the substrate and rotating the substrate about a central axis of the substrate; a first drying process that forms a drying region by discharging a gas onto the surface of the substrate from the central portion of the substrate toward the peripheral portion thereof after supplying the cleaning liquid and by removing the cleaning liquid on the surface of the substrate, while rotating the substrate; and a second drying process that removes the cleaning liquid remaining between the circuit patterns in the drying region by moving a residual liquid removing position of the cleaning liquid remaining between the circuit patterns in a diametrical direction of the substrate, while rotating the substrate.

The residual liquid removing position of the cleaning liquid remaining between the circuit patterns in the second drying process may be located to be spaced apart from a gas discharge position in the first drying process by a distance no smaller than a unit exposure region for forming the circuit patterns in order to suppress non-uniform distribution of the cleaning liquid remaining between the circuit patterns. Here, the term "unit exposure region" refers to a region to which light is irradiated through one time exposure (shot) by an exposure apparatus. Further, the unit exposure region is a distance in consideration of rotation of the substrate and a rectangular region irradiated by one time exposure (shot). When a maximum exposure area of the exposure apparatus is, e.g., about 26 mm×about 33 mm, the distance no smaller than the unit exposure region may be a distance equal to or larger than a diagonal length of the unit exposure region, about 42.011 mm.

In the first drying process, a moving speed of a gas discharge position may be set to be equal to or larger than a preset value in order to suppress non-uniform distribution of the cleaning liquid remaining between the circuit patterns. In the first drying process, the gas discharge position is set to be equal to or larger than a preset value. If the moving speed of the gas discharge position is set to be low, an amount of the cleaning liquid remaining between the circuit patterns in a back side of a moving direction of gas discharge position may become smaller than that in a forward side of the moving direction thereof. As a result, distribution of the cleaning liquid remaining between the circuit patterns may become extremely non-uniform, and, accordingly, the pattern may be damaged by a stress generated between the circuit patterns.

As a supply position of the cleaning liquid approaches the peripheral portion of the substrate, a rotation number of the substrate may be reduced in order to control a linear velocity at the supply position of the cleaning liquid to be equal to or smaller than a preset value. By controlling the linear velocity at the supply position of the cleaning liquid to be equal to or smaller than the preset value, the cleaning liquid can be prevented from splattering onto the surface of the rotating substrate when supplying the cleaning liquid thereon.

Between an end of the first drying process and a start of the second drying process, a product of a centrifugal force and a rotation time of the substrate may be controlled at each of positions on the substrate in order to prevent damage of the circuit patterns. With this configuration, it is possible to prevent pattern damage that might be caused by continuously applying a stress generated by the rotation of the wafer W for a preset time while the cleaning liquid remains between the circuit patterns during the time period between the end of the first drying process and the start of the second drying process.

In the second drying process, the cleaning liquid remaining between the circuit patterns may be removed by moving the residual liquid removing position from the central portion of the substrate to the peripheral portion thereof. Further, in the second drying process, the cleaning liquid remaining between the circuit patterns may be removed by moving the residual liquid removing position from the peripheral portion of the substrate toward the central portion thereof.

In the second drying process, the cleaning liquid remaining between the circuit patterns may be removed by discharging a gas onto the surface of the substrate, or the cleaning liquid remaining between the circuit patterns may be removed by guiding and diffusing an air flow generated by rotating the substrate to the drying region through an air flow controller. Further, in the second drying process, the cleaning liquid remaining between the circuit patterns may be removed by being suctioned, or the cleaning liquid remaining between the circuit patterns may be dried and removed by being heated. Furthermore, in the second drying process, the cleaning liquid remaining between the circuit patterns may be removed by discharging an organic solvent onto the surface of the substrate and substituting the cleaning liquid between the circuit patterns with the organic solvent.

In accordance with another aspect of the illustrative embodiment, there is provided a substrate cleaning apparatus for cleaning a surface of a substrate on which circuit patterns are formed. The substrate cleaning apparatus includes a substrate holder configured to hold thereon the substrate such that a central portion of the substrate is coincident with a rotation axis of the substrate holder; a rotating device configured to rotate the substrate holder about the rotation axis thereof; a cleaning liquid nozzle configured to supply a cleaning liquid onto the surface of the substrate held on the substrate holder; a gas nozzle configured to discharge a gas onto the surface of the substrate held on the substrate holder; a residual liquid removing device configured to remove the cleaning liquid remaining between the circuit patterns formed on the surface of the substrate held on the substrate holder; a moving device configured to move the cleaning liquid nozzle, the gas nozzle and the residual liquid removing device; and a controller configured to control the rotating device, the cleaning liquid nozzle, the gas nozzle, the residual liquid removing device and the moving device. In response to a control signal from the controller, while rotating the substrate, the cleaning liquid is supplied from the cleaning liquid nozzle onto the surface of the substrate while the cleaning liquid nozzle is moved from the central portion of the substrate toward a peripheral portion thereof, and a liquid film is formed on an entire surface of the substrate. Further, after supplying the cleaning liquid, the gas is discharged from the gas nozzle onto the surface of the substrate while the gas nozzle is moved from the central portion of the substrate toward the peripheral portion thereof, and the cleaning liquid on the surface of the substrate is removed to form a drying region. Furthermore, the cleaning liquid remaining between the circuit patterns in the drying region is removed by moving the residual liquid removing device in a diametrical direction of the substrate.

A residual liquid removing position of the residual liquid removing device may be located to be spaced apart from a gas discharge position of the gas nozzle by a distance no smaller than a unit exposure region for forming the circuit patterns in order to suppress non-uniform distribution of the cleaning liquid remaining between the circuit patterns.

The residual liquid removing device may be formed of a gas nozzle configured to discharge a gas onto the surface of the substrate, or the residual liquid removing device may be formed of an air flow controller configured to guide and diffuse an air flow generated by the rotation of the substrate to the drying region. Further, the residual liquid removing device may be formed of a suction nozzle configured to suck the cleaning liquid remaining between the circuit patterns, or the residual liquid removing device may be formed of a heating member configured to dry and remove the cleaning liquid remaining between the circuit patterns by irradiating radiant heat to the surface of the substrate. Furthermore, the residual liquid removing device may be formed of an organic solvent discharge nozzle configured to discharge an organic solvent onto the surface of the substrate.

In accordance with still another aspect of the illustrative embodiment, there is provided a computer-readable storage medium having stored thereon computer-executable instructions, in response to execution, causes a substrate cleaning apparatus to perform a substrate cleaning method as described above. Here, the substrate cleaning apparatus is configured to clean a surface of a substrate on which circuit patterns are formed.

In accordance with the illustrative embodiments, the liquid film is formed on the entire surface of the substrate by supplying the cleaning liquid toward the peripheral portion of the substrate from the central portion thereof. With the supply of the cleaning liquid, the gas is discharged to the peripheral portion of the substrate from the central portion thereof. As a result, the cleaning liquid on the surface of the substrate is removed and the drying region is formed. Then, the cleaning liquid remaining between the circuit patterns in the drying region is removed while moving the residual liquid removing position of the cleaning liquid in a diametrical direction of the substrate. Accordingly, in the cleaning process after the developing process in which the minute circuit patterns having the high aspect ratio are formed, the stream of the cleaning liquid can be prevented from being cut, and damage of the circuit patterns can be avoided.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Figure 1:
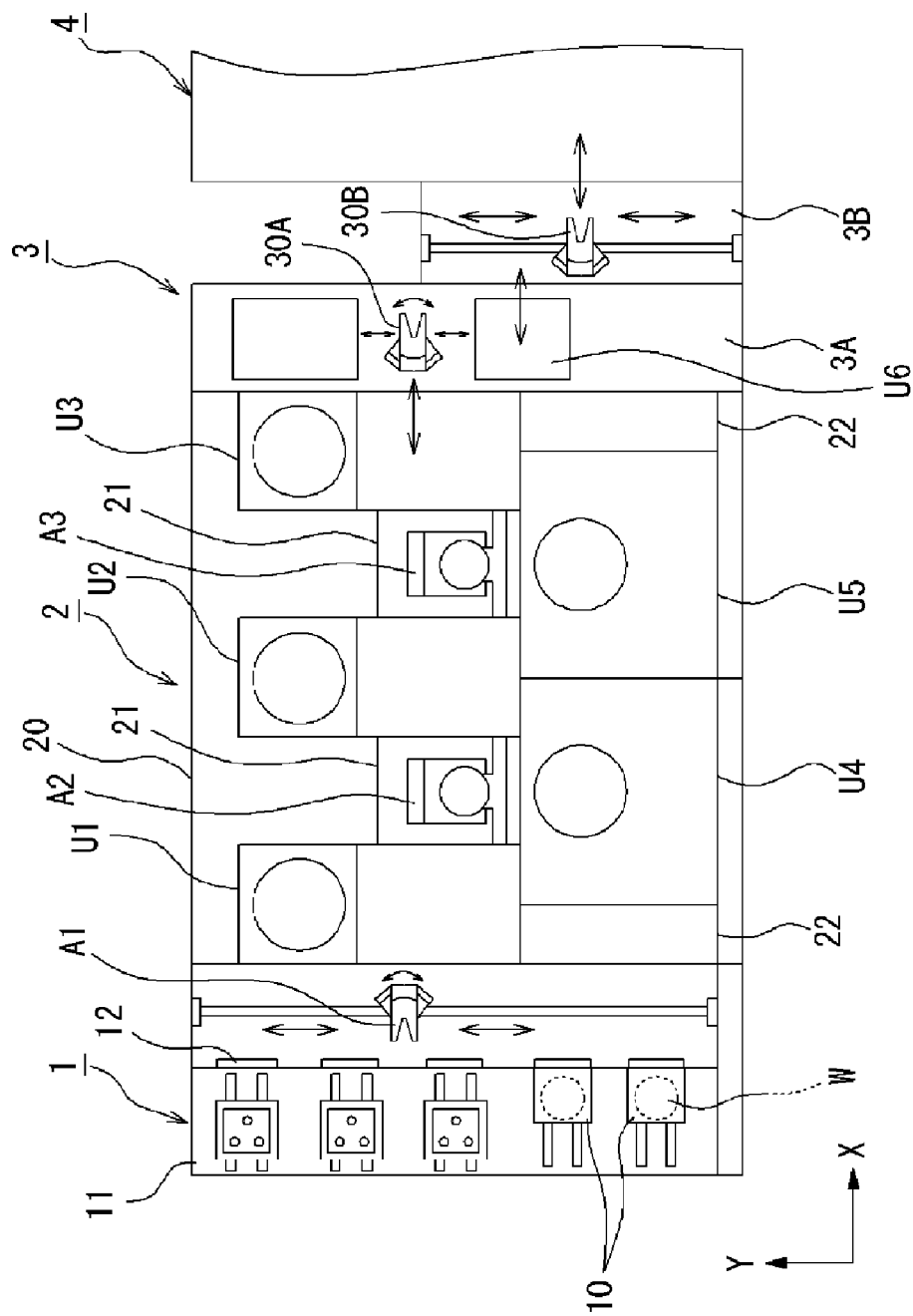
FIG. 1 is a schematic plane view illustrating an entire processing system in which an exposure apparatus is coupled to a coating and developing apparatus including a substrate cleaning apparatus in accordance with illustrative embodiments is applied.

Hereinafter, illustrative embodiments will be described with reference to the accompanying drawings. Here, a substrate cleaning apparatus in accordance with the illustrative embodiments is described to be applied to a processing system in which an exposure apparatus is coupled to a coating and developing apparatus.

The processing system includes a carrier station 1, a processing block 2, an exposure block 4 and an interface block 3. The carrier station 1 is configured to load and unload carriers 10 each of which accommodates therein a multiple number of, e.g., about 25 sheets of wafers W as processing target substrates while being sealed. The processing block 2 is configured to perform a resist coating process, a developing process and so forth on a wafer W taken out of the carrier station 1. The exposure block 4 is configured to perform liquid immersion lithography on a surface of the wafer W after a liquid layer transmitting light is formed on the surface of the wafer W. The interface block 3 is connected between the processing block 2 and the exposure block 4 and configured to transfer the wafer W therebetween.

The carrier station 1 includes a mounting table 11 on which the multiple number of carriers 10 are arranged and mounted; an opening/closing member 12 provided at a front wall surface of the carrier station 1 when viewed from the mounting table 11; and a transfer unit A1 configured to take out the wafer W from the carrier 10 through the opening/closing member 12.

The processing block 2, surrounded by a housing 20, is connected to an inner side of the carrier station 1. In the processing block 2, shelf units U1, U2 and U3 including heating and cooling units in multiple levels are arranged at a left side of the processing block 2 in sequence from a front when viewed from the carrier station 1, and liquid processing units U4 and U5 are arranged at the right side thereof. Main transfer units A2 and A3 configured to transfer the wafer W between each of the units are provided between the shelf units U1, U2 and U3. That is, the main transfer units A2 and A3 and the shelf units U1 to U3 are alternately arranged. Further, each of the main transfer units A2 and A3 is placed within a space surrounded by, when viewed from the carrier station 1, one sides of the shelf units U1 and U2 or U2 and U3 arranged in a forward/backward direction; one side of the liquid processing unit U4 or U5 to be described later at the right side; and a partition wall 21 as a rear surface member forming one surface of the left side thereof.

The interface block 3 includes a first transfer chamber 3A and a second transfer chamber 3B arranged in the forward/backward direction between the processing block 2 and the exposure block 4. A first wafer transfer unit 30A and a second wafer transfer unit 30B are provided in the first transfer chamber 3A and the second transfer chamber 3B, respectively.

Figure 2:
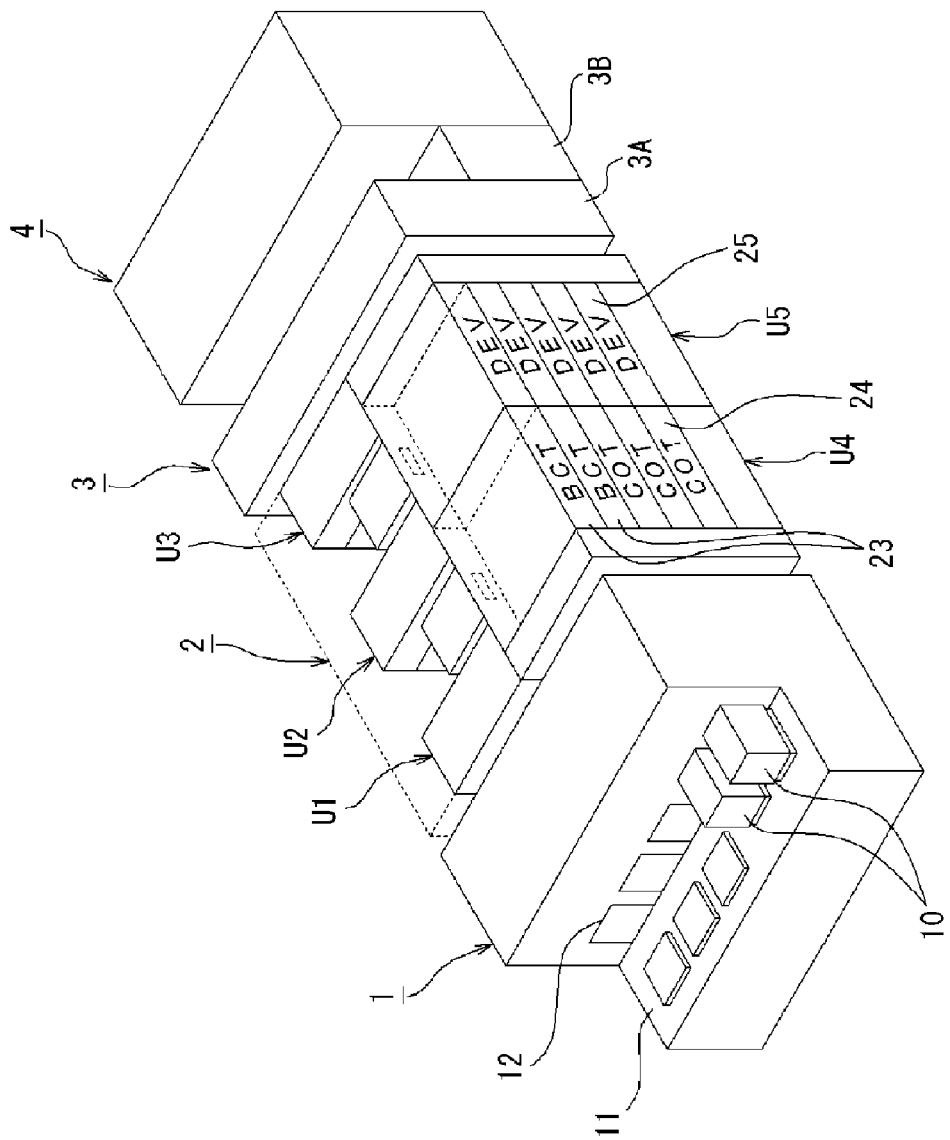
FIG. 2 is a schematic perspective view of the processing system of FIG. 1.

Each of the shelf units U1, U2 and U3 includes various units for performing pre-treatment and post-treatment of a process performed in the liquid processing unit U4 or U5. The various units are arranged in multiple levels, e.g., ten levels in each shelf unit. The combination of the various units may include a heating unit HP for heating (baking) the wafer W, a cooling unit CPL for cooling the wafer W, and so forth. Further, each of the liquid processing units U4 and U5 includes, as illustrated in FIG. 2, for example, a bottom anti-reflective coating unit (BCT) 23, a coating unit (COT) 24, a developing unit (DEV) 25, and so forth, which are arranged in multiple levels, e.g., five levels. Here, the bottom anti-reflective coating unit (BCT) 23 is configured to coat an antireflection film on a wafer having thereon a chemical liquid such as a resist or a developing liquid, and the developing unit (DEV) 25 is configured to perform a developing process by supplying a developing liquid to the wafer W. The substrate cleaning apparatus in accordance with the illustrative embodiments is provided in the developing unit (DEV) 25.

Now, a moving flow of the wafer W in the above-described processing system will be briefly explained. First, after a carrier 10 accommodating therein the wafers W is mounted on the mounting table 11 from the outside, a lid of the carrier 10 is separated while the opening/closing member 12 is opened, and the wafer W is taken out of the carrier 10 by the transfer unit A1. Then, the wafer W is transferred to the main transfer unit A2 through a transfer unit serving as one level of the shelf unit U1. Then, in one level of the shelf unit U1 or U2, the antireflection film is formed on the wafer W as a pre-treatment for a coating process or a substrate temperature control is performed by a cooling unit.

Thereafter, the wafer W is transferred into the coating unit (COT) 24 by the main transfer unit A2, and a resist film is formed on the surface of the wafer W. The wafer W having the resist film formed thereon is taken out of the coating unit (COT) 24 by the main transfer unit A2, and then, is loaded into the heating unit HP in which the wafer W is baked at a preset temperature. After the baking process is completed, the wafer W is cooled in the cooling unit CPL and loaded into the interface block 3 through a transfer unit of the shelf unit U3. The wafer W is then loaded into the exposure block 4 through the interface block 3. Further, when coating a protection film for the liquid immersion lithography on the resist film, a chemical liquid for forming the protection film is coated on the wafer W in a non-illustrated unit within the processing block 2 after cooling the wafer W by the cooling unit. Thereafter, the wafer W is loaded into the exposure block 4 in which the liquid immersion lithography is performed. Here, before performing the liquid immersion lithography, the wafer W may be cleaned by a non-illustrated substrate cleaning apparatus in accordance with the illustrative embodiments provided within the interface block 3.

After the liquid immersion lithography is completed, the wafer W is taken out of the exposure block 4 by the second wafer transfer unit 30B and loaded into a heating unit (PEB) serving as one level of a shelf unit U6. Thereafter, the wafer W is unloaded from the heating unit (PEB) by the first wafer transfer unit 30A and conveyed to the main transfer unit A3.

Then, the wafer W is loaded into the developing unit (DEV) 25 by the main transfer unit A3. In the developing unit (DEV) 25, a substrate developing process and a substrate cleaning process are performed by the substrate cleaning apparatus, which is configured to perform both the developing process and the cleaning process, in accordance with the illustrative embodiments. Afterward, the wafer W is unloaded from the developing unit (DEV) 25 by the main transfer unit A3 and returned back into the carrier 10 on the mounting table 11 via the main transfer unit A2 and the transfer unit A1.

(First Illustrative Embodiment)

Now, a first illustrative embodiment in which a substrate cleaning apparatus in accordance with the illustrative embodiment is combined to a developing apparatus will be explained with reference to FIGS. 3 and 4.

Figure 3:
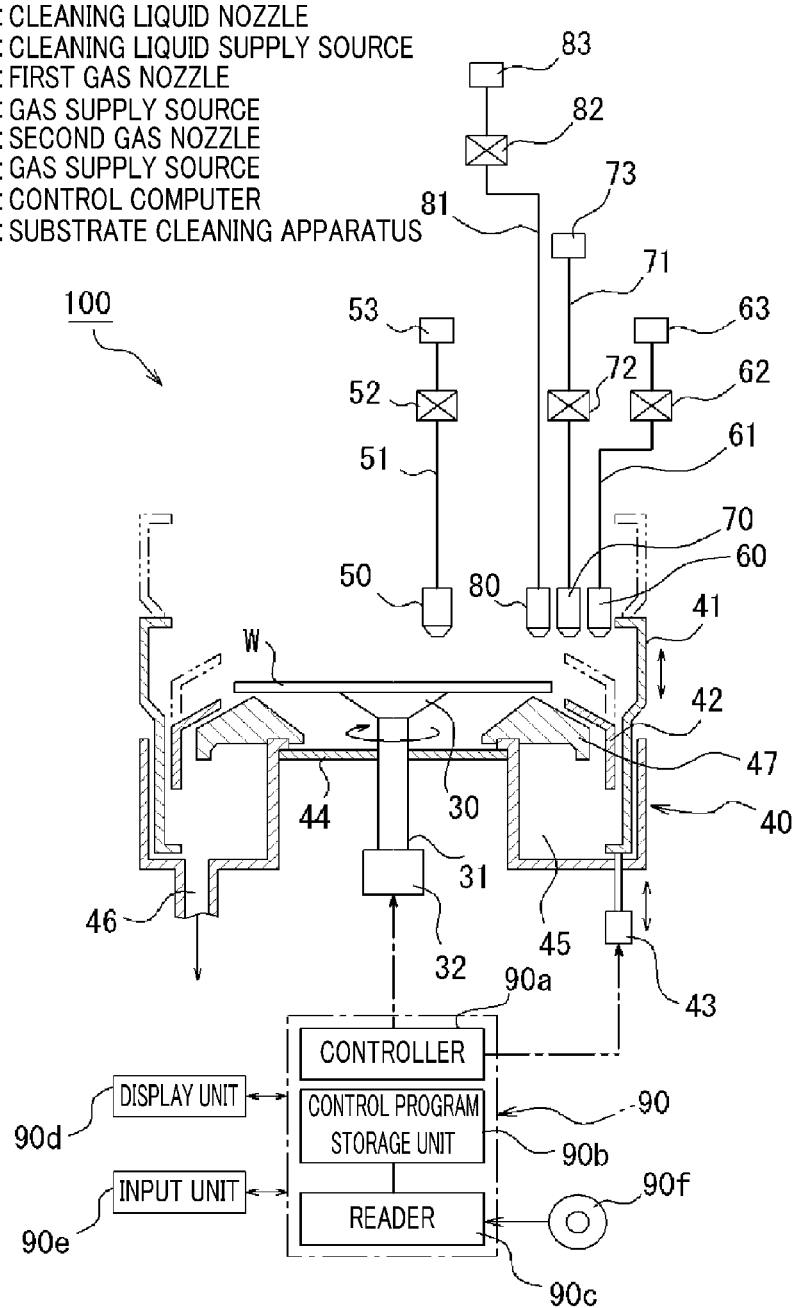
FIG. 3 is a schematic longitudinal cross sectional view of a developing apparatus including a substrate cleaning apparatus in accordance with a first illustrative embodiment is applied.
Figure 4:
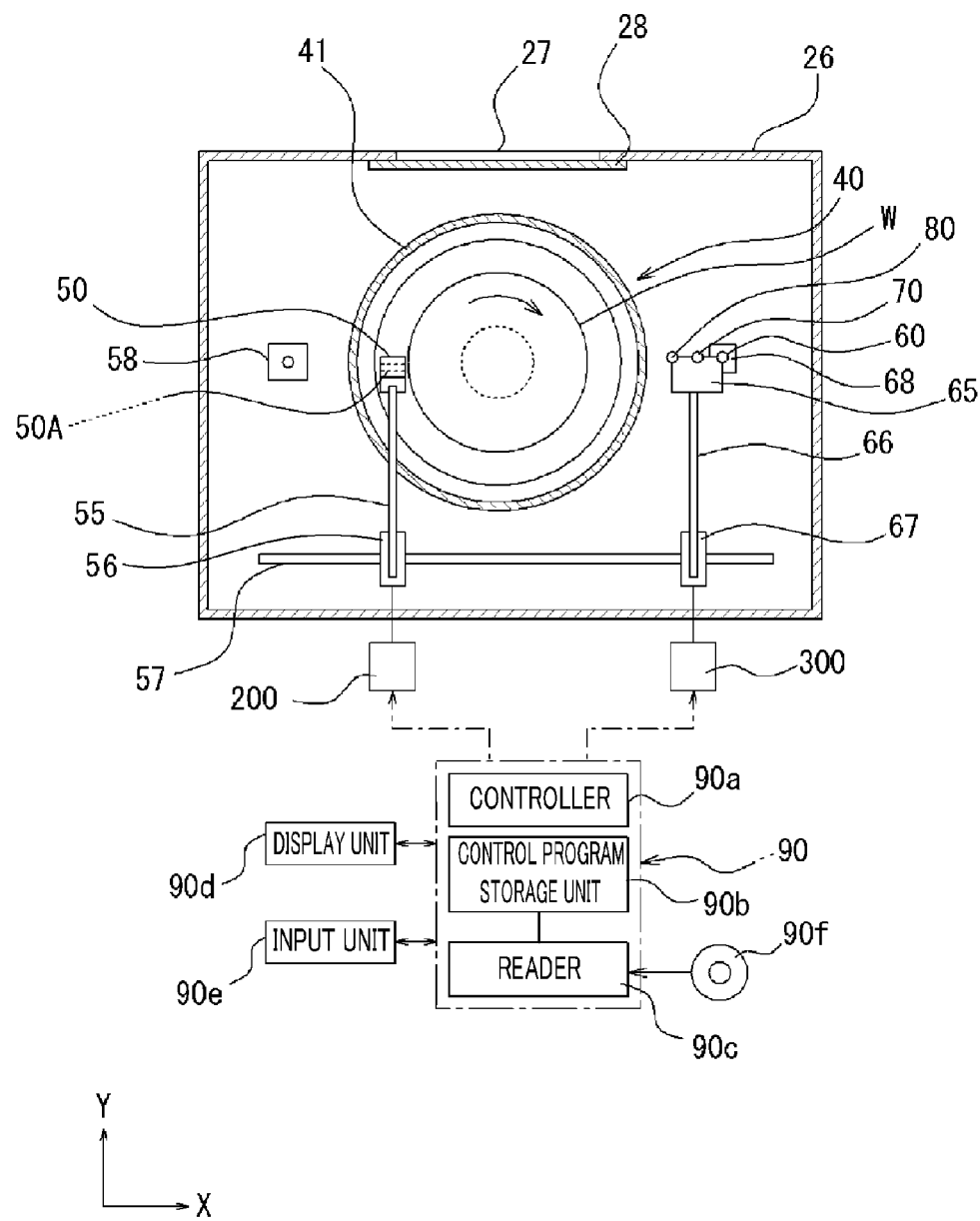
FIG. 4 is a plane view illustrating the substrate cleaning apparatus in accordance with the first illustrative embodiment.

As illustrated in FIGS. 3 and 4, a substrate cleaning apparatus 100 includes, in a casing 26, a spin chuck 30 as a substrate holder configured to hold thereon a wafer W horizontally by attracting and holding a central portion of a rear surface of the wafer W. The spin chuck 30 is connected to a rotating device 32 such as a servo motor via a shaft 31. The spin chuck 30 is rotated by the rotating device 32 while holding the wafer W thereon. Further, the rotating device 32 is electrically connected with a controller 90a of a control computer 90 serving as a control unit. A rotation number of the spin chuck 30 is controlled in response to a control signal from the control computer 90. Further, the casing 26 has a loading/unloading opening 27 for the wafer W, and a shutter 28 is provided at the loading/unloading opening 27 to open and close the loading/unloading opening 27.

A cup 40 having a top opening is provided to surround a lateral side of the wafer W on the spin chuck 30. The cup 40 includes a cylindrical outer cup 41; and a barrel-shaped inner cup 42 having an inwardly inclined upper portion. The outer cup 41 is moved up and down by an elevation device 43 such as a cylinder connected to a lower end of the outer cup 41. The inner cup 42 is also moved up and down by being pressed upward by a stepped portion formed on an inner surface of the lower end of the outer cup 41. Further, the elevation device 43 is electrically connected with the control computer 90 and is driven to move the outer cup 41 up and down in response to a control signal from the control computer 90.

A circular plate 44 is provided under the spin chuck 30. A liquid collecting unit 45 having a recess-shaped cross section is provided at an outside of the circular plate 44 along an entire circumference of the circular plate 44. A drain outlet 46 is formed in a bottom surface of the liquid collecting unit 45. The developing liquid or a cleaning liquid collected in the liquid collecting unit 45 by overflowing from the wafer W or by being scattered therefrom is discharged to the outside of the substrate cleaning apparatus 100 through the drain outlet 46. Further, a ring member 47 having a cone shape tapering to the top is disposed at the outside of the circular plate 44. There are provided, e.g., three elevation pins (not shown) serving as substrate supporting pins, and these elevation pins are provided to penetrate the circular plate 44. The wafer W is mounted onto the spin chuck 30 by cooperation of the elevation pins and a substrate transfer device (not shown).

Meanwhile, a developing liquid nozzle 50, a cleaning liquid nozzle 60, a first gas nozzle 70 and a second gas nozzle 80 are provided above the wafer W held on the spin chuck 30 to be movable vertically and horizontally. The cleaning liquid nozzle 60 is configured to discharge the cleaning liquid onto the surface of the wafer W. The first gas nozzle 70 is configured to discharge a gas to a liquid film formed by supplying the cleaning liquid from the cleaning liquid nozzle 60 to form a drying region D (see FIG. 7). The second gas nozzle 80 serves as a residual liquid removing device that removes the cleaning liquid remaining between circuit patterns in the drying region D and containing dissolved products.

The developing liquid nozzle 50 includes, for example, a slit-shaped discharge opening 50A through which the developing liquid is supplied to the wafer W held on the spin chuck 30 in a band shape. The discharge opening 50A is formed such that a lengthwise direction thereof coincides with a radial direction of the wafer W. The developing liquid nozzle 50 is connected to a developing liquid supply source 53 via a developing liquid supply line 51 on which a flow rate controller 52 is provided. A flow rate and a supply time of the developing liquid may be controlled by the flow rate controller 52 such as a flow rate control valve.

Further, the developing liquid nozzle 50 is supported at one end of a nozzle arm 55 serving as a supporting member, and the other end of the nozzle arm 55 is connected to a movable base 56 including a non-illustrated elevation device. The movable base 56 is configured to be moved in a transversal direction by a nozzle moving device 200 along, e.g., a guide member 57 extended at a bottom surface of the casing 26 in an X direction. The nozzle moving device 200 may be formed of, e.g., a ball screw device or a timing belt device. Further, a standby section 58 for the developing liquid nozzle 50 is provided at an outside of the cup 40. In the standby section 58, a leading end of the developing liquid nozzle 50 is cleaned, for example.

Further, the cleaning liquid nozzle 60 is disposed above the spin chuck 30 and is connected to a cleaning liquid supply source 63 via a cleaning liquid supply line 61 on which a flow rate controller 62 is provided. A flow rate and a supply time of the cleaning liquid may be controlled by a flow rate controller 62 such as a flow rate control valve.

The cleaning liquid supply source 63 is connected with a temperature controller (not shown) that has a heating device such as a heater and controls the cleaning liquid to a certain temperature. Further, the cleaning liquid supply line 61, having the flow rate controller 62, is surrounded by a temperature maintenance member (not shown) formed of a heat insulating member or the like. Accordingly, the cleaning liquid is maintained at the certain temperature until it is supplied onto the wafer W from the cleaning liquid nozzle 60.

In addition, the cleaning liquid nozzle 60 is fixed to a nozzle arm 66 via a nozzle holder 65, as illustrated in FIG. 4. The nozzle arm 66 is connected to a movable base 67 including an elevation device. The movable base 67 is configured to be moved by a nozzle moving device 300 in the transversal direction along, e.g., the guide member 57 without interfering with the developing liquid nozzle 50. Here, the nozzle moving device 300 may be formed of, e.g., a ball screw device or a timing belt device. Further, a standby section 68 for the cleaning liquid nozzle 60 is provided at the outside of the cup 40. Here, the standby section 68 is located opposite to the standby section 58 for the developing liquid nozzle 50 with the cup 40 therebetween.

The first gas nozzle 70 is connected to a gas supply source 73 via a gas supply line 71 on which a gas flow rate controller 72 is provided. Further, in accordance with the present illustrative embodiment, an inert gas such as $N_2$ (nitrogen) gas is used as a gas discharged from the first gas nozzle 70. Further, the first gas nozzle 70 is fixed to, e.g., the common nozzle holder 65 to which the cleaning liquid nozzle 60 is also fixed. Accordingly, the first gas nozzle 70 is configured to be moved as one body with the cleaning liquid nozzle 60 by the nozzle arm 66.

The second gas nozzle 80 is connected to a gas supply source 83 via a gas supply line 81 on which a gas flow rate controller 82 is provided. Further, in accordance with the present illustrative embodiment, an inert gas such as $N_2$ (nitrogen) gas or argon (Ar) gas is used as a gas discharged from the second gas nozzle 80. Further, the second gas nozzle 80 is fixed to, e.g., the common nozzle holder 65 to which the cleaning liquid nozzle 60 and the first gas nozzle 70 are also fixed. Accordingly, the second gas nozzle 80 is configured to be moved as one body with the cleaning liquid nozzle 60 by the nozzle arm 66.

Figure 5:
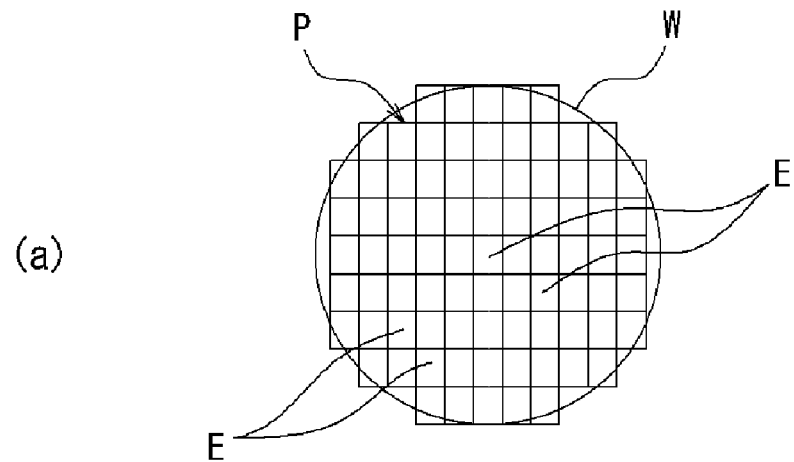
FIG. 5 provides a schematic plane view (a) of a circuit pattern in accordance with the illustrative embodiments and a schematic plane view (b) enlarging a unit exposure region for forming the circuit pattern, respectively.
Figure 5:
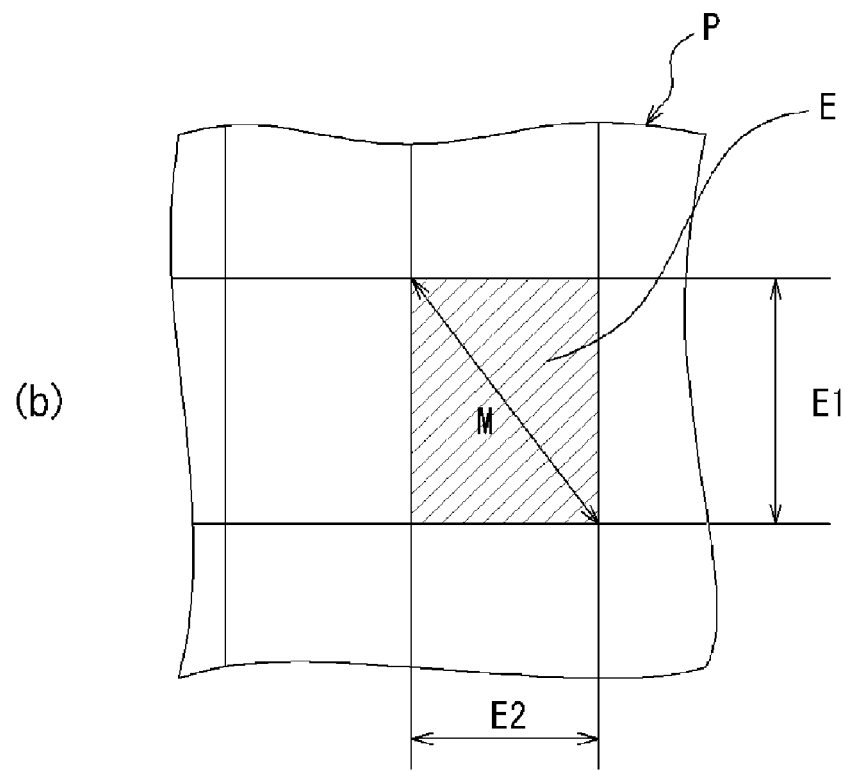

Here, the second gas nozzle 80 is disposed apart from the first gas nozzle 70 by a distance no smaller than a unit exposure region E for forming a circuit pattern P (see FIG. 5). Here, the term "unit exposure region" refers to a region to which light is irradiated through one time exposure (shot) by an exposure apparatus of the exposure block 4. To elaborate, the unit exposure region is a distance in consideration of the rotation of the wafer W and a rectangular region irradiated by one time exposure (shot). When a maximum exposure area of the exposure apparatus is, e.g., short side E2×long side E1=about 26 mm×about 33 mm, the distance no smaller than the unit exposure region may be a distance equal to or larger than a diagonal length M of the unit exposure region E=about 42.011 mm.

As stated above, by disposing the second gas nozzle 80 apart from the first gas nozzle 70 by the distance equal to or larger than the diagonal length M of the unit exposure region E for forming the circuit pattern P, non-uniform distribution of residual liquid between the circuit patterns can be suppressed. Accordingly, it may be possible to prevent pattern from being damaged while being caused by a stress balance between the circuit patterns caused by the non-uniform distribution of the residual liquid between the circuit patterns.

The nozzle moving device 200 configured to move the developing liquid nozzle 50, the nozzle moving device 300 configured to move the cleaning liquid nozzle 60, the first gas nozzle 70 and the second gas nozzle 80, the rotating device 32 configured to rotate the spin chuck 30, the elevation device 43 configured to move up and down the cup 40, the flow rate controller 52 configured to control the flow rate of the developing liquid, the flow rate controller 62 configured to control the flow rate of the cleaning liquid, and the gas flow rate controllers 72 and 82 configured to control the flow rates of the gases are controlled by the controller 90a.

The controller 90a is embedded in the control computer 90. Besides the controller 90a, the control computer 90 also has therein a control program storage unit 90b configured to store therein a program for implementing respective processes of operations performed by the substrate cleaning apparatus 100; and a reader 90c. The operations will be described later. Further, the control computer 90 also includes an input unit 90e connected to the controller 90a; a display unit 90d that displays a processing state for setting processes; a computer-readable storage medium, installed in the reader 90c, storing thereon software for executing a control program in the control computer 90. Based on the control program, the control computer 90 outputs a control signal to the respective units.

Further, the control program may be stored in a storage medium 90f such as a hard disk, a compact disk, a flash memory, a flexible disk or a memory card. The control program is installed in the control computer 90 from the storage medium 90f to be executed.

Now, an operation of the substrate cleaning apparatus 100 having the above-described configuration will be discussed. First, when the wafer W is not loaded in the substrate cleaning apparatus 100, the outer cup 41 and the inner cup 42 are positioned at lowered positions, and the developing liquid nozzle 50, the cleaning liquid nozzle 60, the first gas nozzle 70 and the second gas nozzle 80 stand by at the standby positions thereof, respectively. In the above-described system, if the wafer W on which the liquid immersion lithography is performed is loaded into the substrate cleaning apparatus 100 by the main transfer unit A3 (see FIG. 1) after being heated, the wafer W is mounted onto the spin chuck 30 by the cooperation of the main transfer unit A3 and the non-illustrated elevation pins. Further, in this illustrative embodiment, as for the wafer W on which minute circuit patterns P having a high aspect ratio (e.g., equal to or higher than 4) are formed, a resist material having high water repellence is used. A static contact angle of water on the surface of the wafer W loaded into the substrate cleaning apparatus 100 is, for example, about 90 degrees.

Subsequently, the outer cup 41 and the inner cup 42 are moved up. The developing liquid is supplied onto the wafer W from the developing liquid nozzle 50. The developing liquid is supplied by a well-known method in the art. In accordance with the present illustrative embodiment, when the supply of the developing liquid is started, the developing liquid nozzle 50 is positioned above a peripheral portion of the wafer W, e.g., several millimeters above the surface of the wafer W. While rotating the wafer W at a rotation number of, e.g., from about 1000 rpm to about 1200 rpm and discharging the developing liquid from the developing liquid nozzle 50 in a band shape, the developing liquid nozzle 50 is moved from the peripheral portion of the wafer W toward a central portion thereof. The developing liquid discharged in the band shape from the developing liquid nozzle 50 is supplied from an outer side of the wafer W toward an inner side thereof without being disconnected. Accordingly, the developing liquid is supplied onto the entire surface of the wafer W in a spiral shape. The developing liquid is then diffused to the outer side on the surface of the wafer W by a centrifugal force generated by the rotation of the wafer W, and a thin liquid film is formed. A soluble portion of the resist is dissolved in the developing liquid. As a result, a non-soluble portion of the resist remains, and a circuit pattern is formed.

Figure 6:
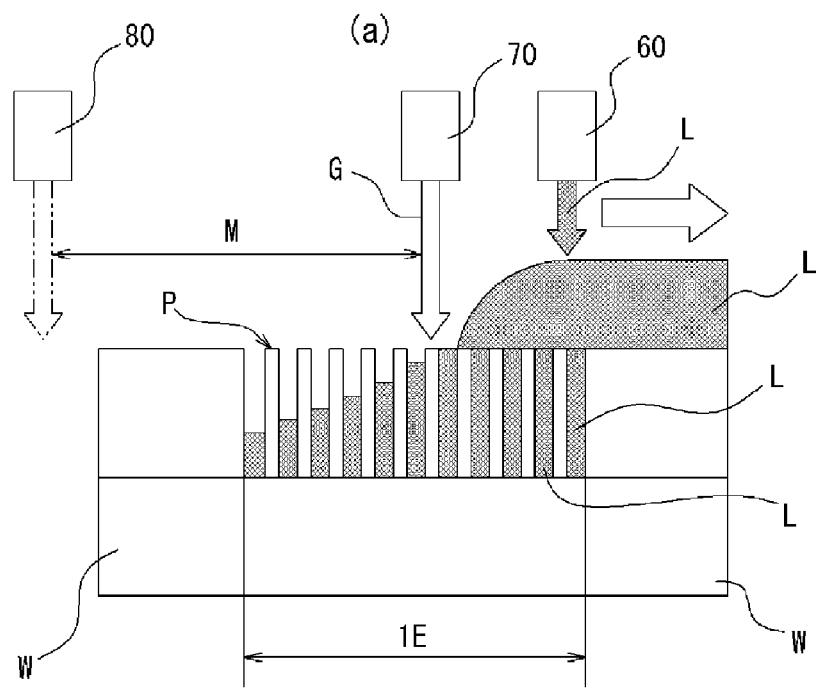
FIG. 6 provides a schematic cross sectional view (a) illustrating a liquid film forming process and a first drying process, and a schematic cross sectional view (b) illustrating a second drying process in accordance with the first illustrative embodiment, respectively.
Figure 6:
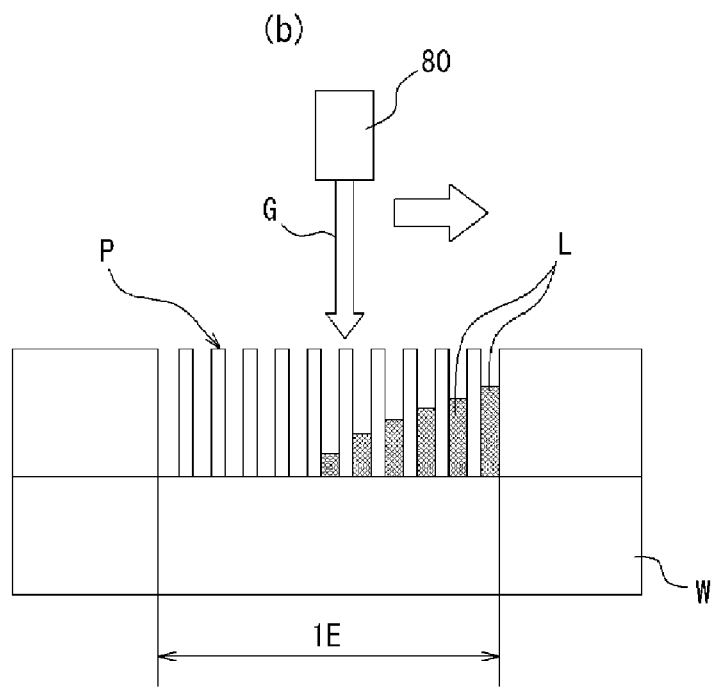

Thereafter, the cleaning liquid nozzle 60 is placed above the central portion of the wafer W to be substituted for the developing liquid nozzle 50. Immediately after the developing liquid nozzle 50 stops the supply of the developing liquid, a cleaning liquid L is promptly discharged from the cleaning liquid nozzle 60 to clean the surface of the wafer W. Below, this cleaning process will be elaborated in detail with reference to FIGS. 6 and 7.

The cleaning process in accordance with the present illustrative embodiment is performed through steps as follows.

(Step 1)

The cleaning liquid nozzle 60 is placed above the central portion of the wafer W, e.g., about 15 mm above the surface of the wafer W. While rotating the spin chuck 30 at a rotation speed of, e.g., about 1000 rpm, the cleaning liquid L such as pure water is discharged toward the central portion of the wafer W from the cleaning liquid nozzle 60 at a flow rate of, e.g., about 350 m/L for, e.g., about 5 seconds. The cleaning liquid L is diffused from the central portion of the wafer W toward the peripheral portion thereof by the centrifugal force, and the developing liquid is substituted with the cleaning liquid L. Accordingly, a liquid film of the cleaning liquid L is formed on the entire surface of the wafer W.

(Step 2)

Figure 7:
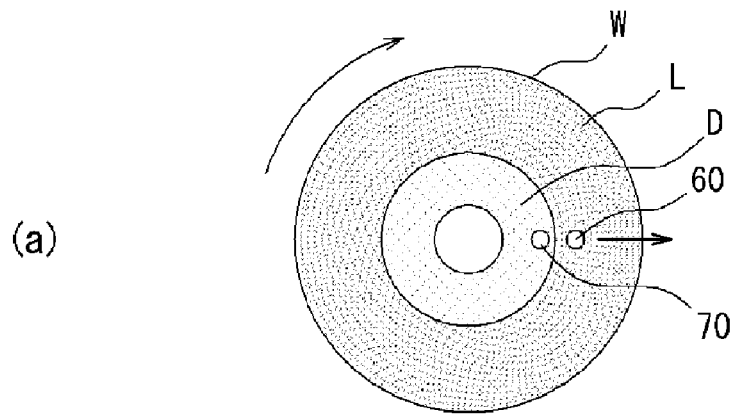
FIG. 7 is a schematic plane view illustrating the liquid film forming process, the first drying process and the second drying process in accordance with the first illustrative embodiment.
Figure 7:
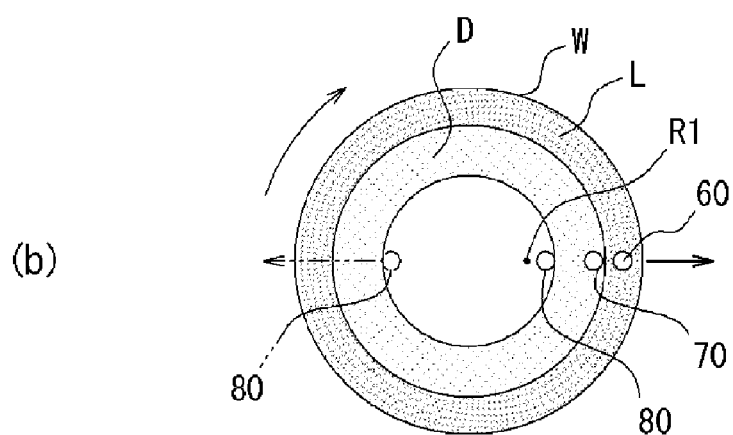
Figure 7:
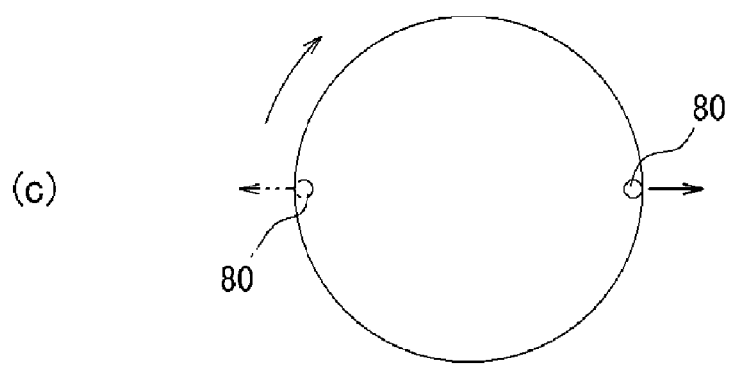

Subsequently, while rotating the spin chuck 30 at a rotation speed equal to or higher than about 1500 rpm, e.g., about 2500 rpm, the nozzle arm 66 (see FIG. 4) is moved. As a result, the cleaning liquid nozzle 60 is moved from the central portion of the wafer W toward the peripheral portion thereof by a certain distance, and the first gas nozzle 70 is placed above the central portion of the wafer W, as shown in FIG. 7(*a*). At this time, the cleaning liquid nozzle 60 is moved at a moving speed of, e.g., about 2 mm/sec while discharging the cleaning liquid L at a flow rate of, e.g., about 350 mL/min. Here, if the cleaning liquid nozzle 60 is moved outward from the central portion of the wafer W by a certain distance, the cleaning liquid L is no more supplied to the central portion of the wafer W. Since, however, the centrifugal force is small at the central portion of the wafer W, the liquid film of the cleaning liquid L is maintained in a thin film without being split.

If the first gas nozzle 70 is moved above the central portion of the wafer W, the nozzle arm 66 is stopped, and a $N_2$ gas G, for example, is discharged to the central portion of the wafer W from the first gas nozzle 70. Then, by moving the nozzle arm 66, the cleaning liquid L is discharged from the cleaning liquid nozzle 60 from the central portion of the wafer W toward the peripheral portion thereof to form the liquid film of the cleaning liquid L. With the supply of the cleaning liquid L, the $N_2$ gas G is discharged from the first gas nozzle 70. Accordingly, a thickness of the liquid film of the cleaning liquid L becomes thin, and then, the liquid film is removed so that the drying region D (see FIGS. 6(*a*) and. 7(*a*)) is formed. Here, the term "drying region D" refers to a region where the cleaning liquid L is vaporized and, thus, the surface of the wafer W is exposed. In this illustrative embodiment, this term "drying region D" includes a region where the cleaning liquid L remains between the circuit patterns on the wafer W. A core of the drying region D is diffused by the centrifugal force from the central portion of the wafer W to a supply position of the cleaning liquid L.

Further, in order to form the effective drying region D, the cleaning liquid nozzle 60 and the first gas nozzle 70 need to be arranged while spaced apart from each other at a proper separation distance. In accordance with the present illustrative embodiment, the separation distance is set to be, e.g., from about 9 mm to about 15 mm. If the separation distance is smaller than, e.g., about 9 mm, the liquid film of the cleaning liquid L may not become sufficiently thin, so that the drying region D may not be formed effectively. If the separation distance is larger than, e.g., about 15 mm, on the other hand, the cleaning liquid L may be dried at a wide range for a short time, resulting in many defects.

Further, if the cleaning liquid L from the cleaning liquid nozzle 60 is continuously supplied until the cleaning liquid nozzle 60 reaches the peripheral portion of the wafer W, the cleaning liquid L may splatter upward at the peripheral portion of the wafer W, particularly, at a notch portion and may return back to the surface of the wafer W as mist. Thus, it may be desirable to stop the supply of the cleaning liquid L right before the cleaning liquid nozzle 60 reaches the peripheral portion of the wafer W.

Figure 8:
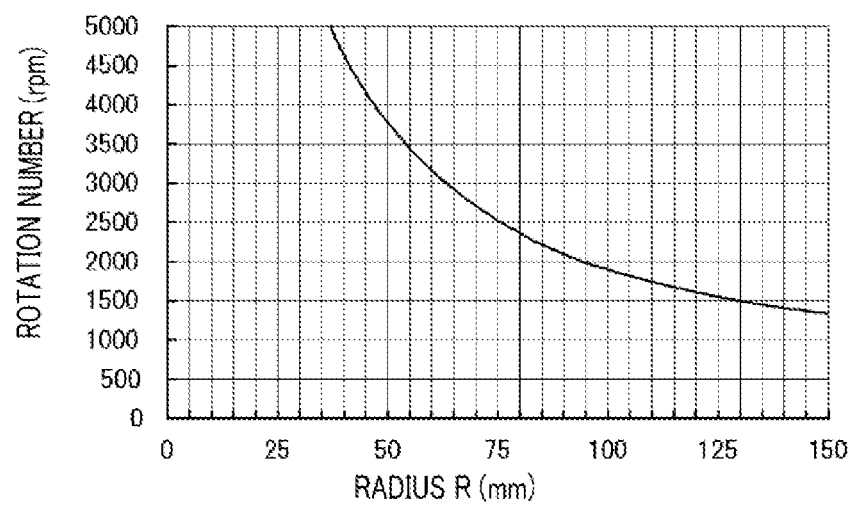
FIG. 8 is a graph showing a rotation number (rpm) of a substrate for controlling a linear velocity of a cleaning liquid supply position to be constant.

Furthermore, in accordance with the present illustrative embodiment, when moving the cleaning liquid nozzle 60 and the first gas nozzle 70 from the central portion of the wafer W to the peripheral portion thereof, the rotation number of the wafer W is controlled to be reduced as a cleaning liquid supply position of the cleaning liquid nozzle 60 approaches the peripheral portion of the wafer W in order to set a linear velocity (circumferential velocity) at the cleaning liquid supply position of the cleaning liquid nozzle 60 to be equal to or smaller than a certain value. Further, assuming that the flow rate of the cleaning liquid L is, e.g., about 50 mm/sec; a discharge angle with respect to a rotation direction is, e.g., about 60 degrees; and a surface contact angle is, e.g., about 90 degrees, an upper limit of the circumferential velocity becomes, e.g., about 2000 mm/sec. In this case, an optimum rotation number of the wafer W at the cleaning liquid supply position of the cleaning liquid nozzle 60 is controlled based on the graph shown in FIG. 8. In this way, by controlling the rotation number of the wafer W, the cleaning liquid L can be prevented from splattering onto the surface of the wafer W.

Further, the moving speed of the cleaning liquid nozzle 60 and the first gas nozzle 70 from the central portion of the wafer W to the peripheral portion thereof is controlled to be equal to or higher than a certain velocity capable of suppressing non-uniformity in the distribution of the cleaning liquid L between the circuit patterns due to the $N_2$ gas G discharged from the first gas nozzle 70. In the present illustrative embodiment, if a flow velocity of the $N_2$ gas G is, e.g., about 5 L/min and a discharge angle of the $N_2$ gas G with respect to the rotation direction is, e.g., about 90 degrees, the moving speed of the cleaning liquid nozzle 60 and the first gas nozzle 70 may be set to be equal to or higher than, e.g., about 2 mm/sec. If the moving speed is set to be lower than, e.g., about 2 mm/sec, an amount of the cleaning liquid L remaining between the circuit patterns behind the first gas nozzle 70 in a moving direction thereof may become smaller than an amount of the cleaning liquid L remaining between the circuit patterns in front of the first gas nozzle 70. As a result, the distribution of the cleaning liquid L remaining between the circuit patterns may become extremely non-uniform, and, accordingly, by a stress between the circuit patterns, the pattern may be damaged.

(Step 3)

When the cleaning liquid nozzle 60 and the first gas nozzle 70 reaches a preset position from the central portion of the wafer W, a gas discharge position of the second gas nozzle 80 reaches a position R1, and a $N_2$ gas G is discharged from the second gas nozzle 80 toward the drying region D. Thus, the cleaning liquid L remaining between the circuit patterns is removed (see FIGS. 6(*b*) and 7(*b*)). Further, the second gas nozzle 80 is moved to the peripheral portion of the wafer W and completely removes (discharges out) the cleaning liquid L remaining between the circuit patterns of the wafer W.

Figure 9:
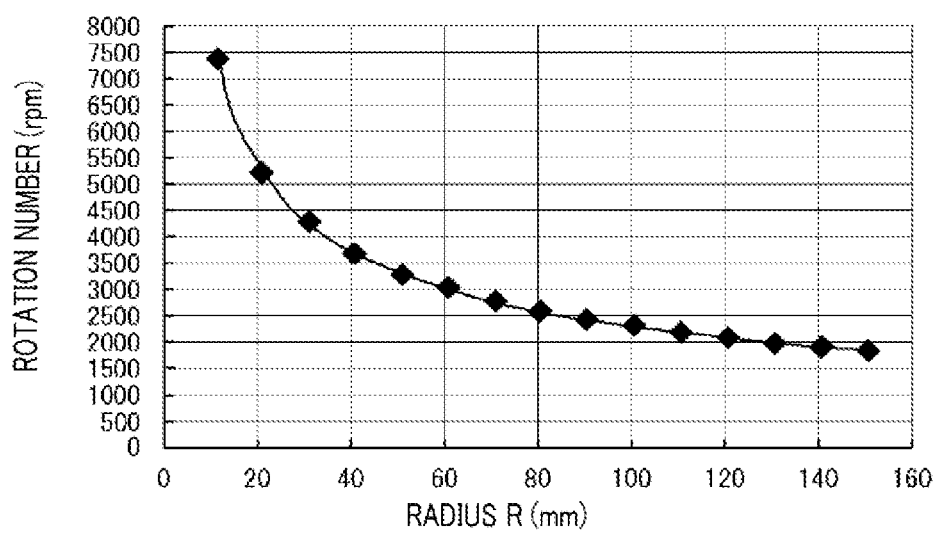
FIG. 9 is a graph showing a threshold value of a rotation number (rpm) of a substrate at which pattern damage does not occur during a period after the first drying process is stopped and before the second drying process is started.

Further, in accordance with the first illustrative embodiment, between the end of the drying region forming process (first drying process) of forming the drying region D by discharging the $N_2$ gas G from the first gas nozzle 70 and the start of the cleaning liquid removing process (second drying process) of removing the cleaning liquid L between the circuit patterns by discharging the $N_2$ gas G from the second gas nozzle 80, it is possible to prevent the pattern damage caused by a stress balance of the cleaning liquid L remaining between the circuit patterns from occurring. That is, by controlling a product of the centrifugal force and the rotation time of the wafer W, the pattern damage is prevented. In accordance with the present illustrative embodiment, it is assumed that the time period between the end of the first drying process and the start of the second drying process is no more than, e.g., about 20 seconds. In this case, an upper limit of the rotation number of the wafer W at each position is controlled based on the graph shown FIG. 9. Accordingly, it is possible to prevent the pattern damage that might be caused by continuously applying a stress generated by the rotation of the wafer W for a preset time while the cleaning liquid L remains between the circuit patterns during the time period between the end of the first drying process and the start of the second drying process.

Further, in Step 3, at a position where the $N_2$ gas G is discharged from the second gas nozzle 80, the pattern damage that might be caused by the stress balance of the cleaning liquid L remaining between the circuit patterns may be prevented. That is, by controlling the centrifugal force of the wafer W at the position where the $N_2$ gas G is discharged from the second gas nozzle 80, it is possible to prevent the pattern damage that might be caused by continuously applying the stress generated by the rotation of the wafer W for a certain time while the cleaning liquid L remains between the circuit patterns in the second drying process.

Figure 10:
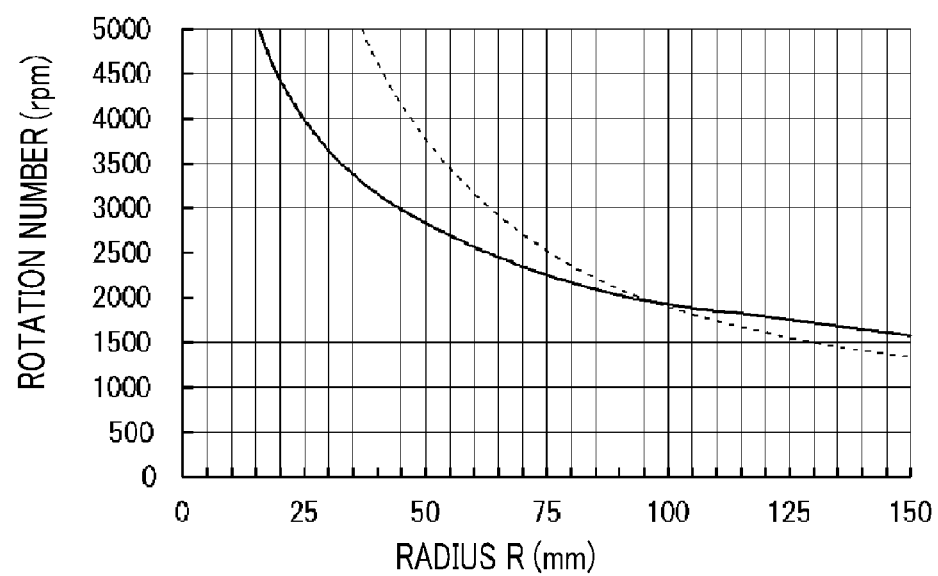
FIG. 10 is a graph showing a threshold value of a rotation number (rpm) of a substrate at which pattern damage does not occur at a residual liquid removing position in the second drying process.
Figure 11:
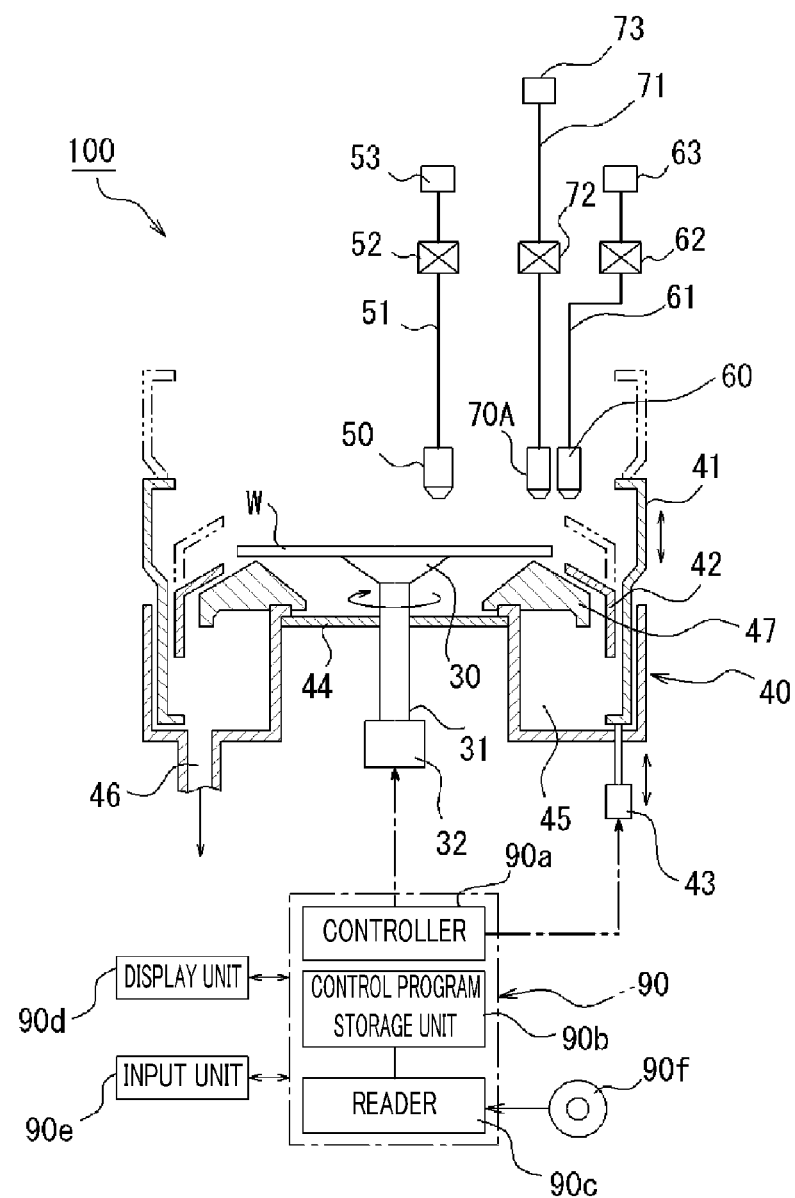
FIG. 11 is a schematic longitudinal cross sectional view of a developing apparatus including a substrate cleaning apparatus in accordance with a second illustrative embodiment is applied.
Figure 12:
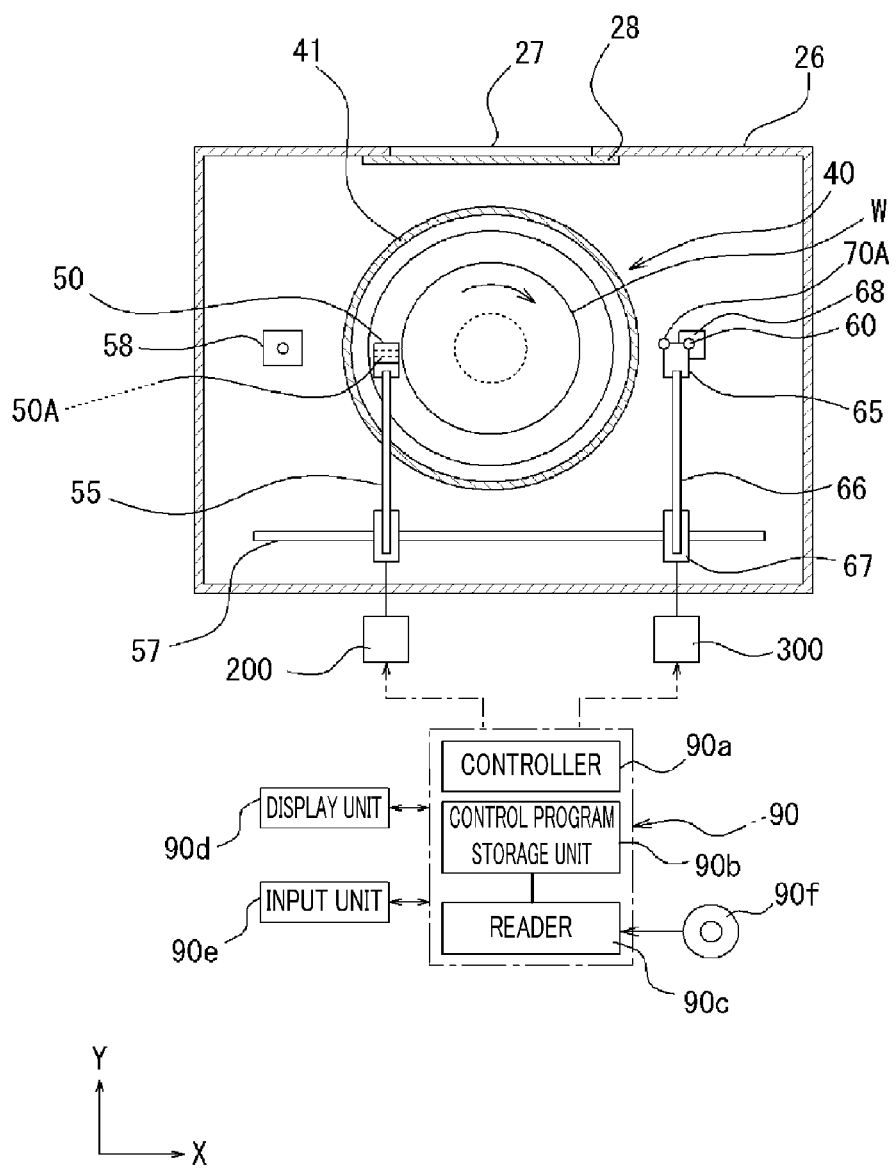
FIG. 12 is a plane view illustrating the substrate cleaning apparatus in accordance with the second illustrative embodiment.
Figure 13:
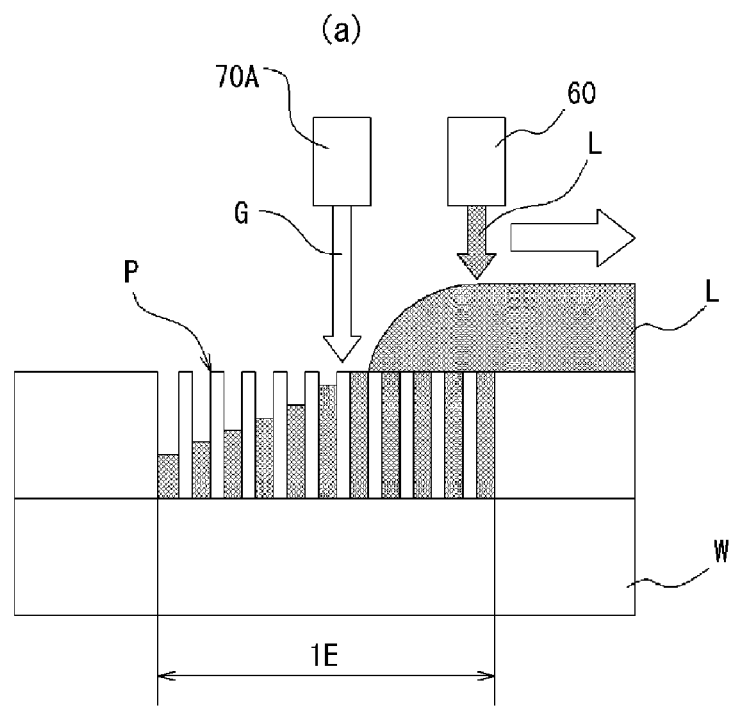
FIG. 13 provides a schematic cross sectional view (a) illustrating a liquid film forming process and a first drying process and a schematic cross sectional view (b) illustrating a second drying process in accordance with the second illustrative embodiment, respectively.
Figure 13:
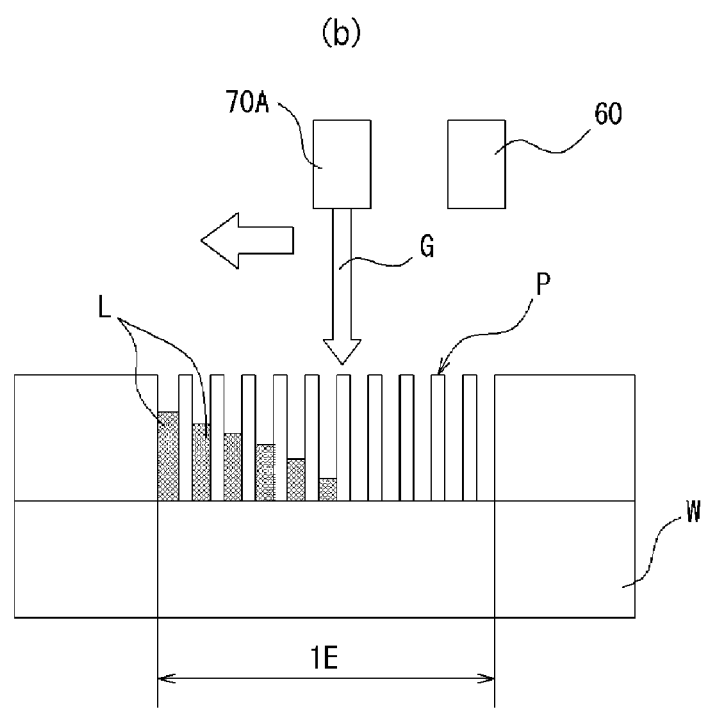
Figure 14:
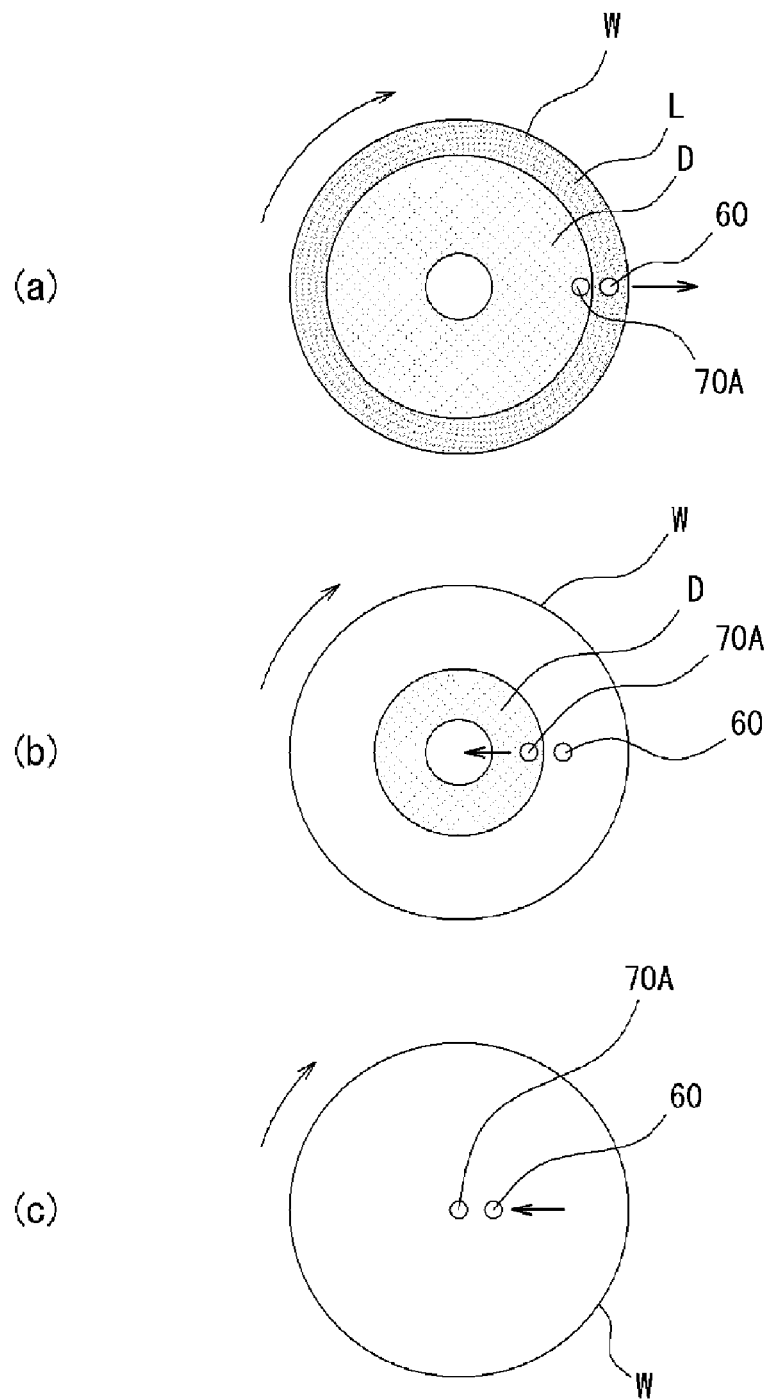
FIG. 14 is a schematic plane view illustrating the liquid film forming process, the first drying process and the second drying process in accordance with the second illustrative embodiment.

In this case, if the cleaning liquid L remains between the circuit patterns by applying the centrifugal force at each position R in the radial direction of the wafer W for a preset time, e.g., about 60 seconds, the pattern damage may occur by the stress generated by the rotation of the wafer W. By way of example, at a position of R=about 150 mm, the pattern damage caused by the stress generated by the rotation of the wafer W occurs at about 2000 rpm×about 60 seconds or more. The rotation number of the wafer W corresponding to a threshold value of this centrifugal force at each position R is shown in the graph of FIG. 10. FIG. 10 is a graph showing a threshold value of the rotation number of the wafer W at each position R, which does not cause the pattern damage, even when continuously rotating the wafer W for a preset time (about 60 seconds) while the cleaning liquid L remains between the circuit patterns. Further, a dashed line in FIG. 10 is the same as the graph of FIG. 8 indicating a threshold value of the rotation number of the wafer W for controlling the linear velocity (circumferential velocity) at the cleaning liquid supply position of the cleaning liquid nozzle 60 in the cleaning liquid supplying process to be constant. As can be seen from FIG. 10, in a region within a radius of, e.g., about 95 mm, the centrifugal force equal to or larger than a threshold value for the pattern damage may be applied to the circuit patterns P after supplying the cleaning liquid L from the cleaning liquid nozzle 60 for a very long time while the cleaning liquid L still remains between the circuit patterns P. Accordingly, by controlling, based on the graph of FIG. 10, the rotation number of the wafer W at each discharge position for discharging the $N_2$ gas G from the second gas nozzle 80, i.e., each position R, the pattern damage may be prevented.

Further, in accordance with the first illustrative embodiment, the cleaning liquid nozzle 60, the first gas nozzle 70 and the second gas nozzle 80 are moved as one body in the same direction from the central portion of the wafer W toward the peripheral portion thereof. However, the second gas nozzle 80 may be configured as a separate body from the cleaning liquid nozzle 60 and the first gas nozzle 70 as long as the second gas nozzle 80 is positioned away from the first gas nozzle 70 by a distance equal to or larger than the unit exposure region E (diagonal length M). Furthermore, as shown by a dashed double-dotted line in FIG. 7, the second gas nozzle 80 may be moved in an opposite direction to the moving direction of the cleaning liquid nozzle 60 and the first gas nozzle 70 while removing the cleaning liquid L between the circuit patterns in the drying region D.

(Step 4)

After the second gas nozzle 80 is moved to the peripheral portion of the wafer W and removes (discharges out) the cleaning liquid L remaining between the circuit patterns on the wafer W, micro-level liquid droplets on the wafer W is scattered and dried by the centrifugal force while setting the rotation number of the wafer W to be, e.g., about 2000 rpm. Concurrently, the cleaning liquid nozzle 60, the first gas nozzle 70 and the second gas nozzle 80 are returned back to the standby positions thereof.

The above-described Steps 1 to 4 are performed as the control computer 90 reads out a control program stored in a memory of the control computer 90 and outputs a control signal for operating each of the above-described components based on the read-out command.

In accordance with the first illustrative embodiment, after developing the wafer W on which the minute circuit patterns P having the high aspect ratio are formed, the cleaning liquid L is supplied to the central portion of the wafer W. Thereafter, the supply position of the cleaning liquid L is moved toward the peripheral portion of the wafer W by a certain distance, and the drying region D is formed by discharging a gas to the central portion of the wafer W from the first gas nozzle 70. Then, while rotating the wafer W, a gas from the second gas nozzle 80 is discharged to the central portion of the wafer W, and the cleaning liquid L remaining between the circuit patterns in the drying region D is removed (discharged out). With this configuration of the first illustrative embodiment, high cleaning effect can be achieved, and the number of a development defect can be reduced to near zero. Further, in accordance with the first illustrative embodiment, by removing the cleaning liquid L remaining between the circuit patterns in the drying region D by discharging the gas from the second gas nozzle 80, it is possible to accelerate the drying of the wafer W. Accordingly, the moving speed of the cleaning liquid nozzle 60 can be increased. As a result, effective cleaning process can be performed in a shorter time period.

(Second Illustrative Embodiment)

Now, a substrate cleaning apparatus and a substrate cleaning method in accordance with a second illustrative embodiment will be elaborated with reference to FIGS. 11 to 14. In accordance with the second illustrative embodiment, there is provided a common gas nozzle 70A functioning as the first gas nozzle 70 and the second gas nozzle 80 in the substrate cleaning apparatus 100 in accordance with the first illustrative embodiment. In a second drying process, by moving the common gas nozzle 70A from the peripheral portion of the wafer W toward the central portion thereof, the cleaning liquid L remaining between the circuit patterns is removed (discharged out). Since the other configuration of the second illustrative embodiment except the common gas nozzle 70A is the same as that of the first illustrative embodiment, same parts will be assigned same reference numerals, and redundant description will be omitted. Afterward, a cleaning process in accordance with the second illustrative embodiment will be described. Since Steps 1 and 2 in the second illustrative embodiment are the same as those of the first illustrative embodiment, same parts will be assigned same reference numerals, and redundant description will be omitted.

(Step 3a)

As illustrated in FIGS. 13(a) and 14(a), by moving the cleaning liquid nozzle 60 and the common gas nozzle 70A from the central portion of the wafer W toward the peripheral portion thereof, the drying region D is formed on the entire surface of the wafer W. Then, by discharging a $N_2$ gas G from the common gas nozzle 70A toward the drying region D, the cleaning liquid L remaining between the circuit patterns is removed (see FIGS. 13(a) and 14(a)). Further, the common gas nozzle 70A is moved toward the central portion of the wafer W and securely removes (discharges out) the cleaning liquid L remaining between the circuit patterns on the wafer W completely.

Further, in accordance with the second illustrative embodiment, between the end of the drying region forming process (first drying process) of forming the drying region D by discharging the $N_2$ gas G from the common gas nozzle 70A and the start of the cleaning liquid removing process (second drying process) of removing the cleaning liquid L between the circuit patterns by discharging the $N_2$ gas G from the common gas nozzle 70A, it is possible to prevent the pattern damage caused by a stress balance of the cleaning liquid L remaining between the circuit patterns from occurring. That is, by controlling the product of the centrifugal force and the rotation time of the wafer W, the pattern damage is prevented.

Further, in Step 3a, at a position where the $N_2$ gas G is discharged from the common gas nozzle 70A, the pattern damage that might be caused by the stress balance of the cleaning liquid L remaining between the circuit patterns may be prevented. That is, by controlling the centrifugal force of the wafer W at the position where the $N_2$ gas G is discharged from the common gas nozzle 70A, it is possible to prevent the pattern damage that might be caused by continuously applying the stress generated by the rotation of the wafer W for a certain time while the cleaning liquid L remains between the circuit patterns in the second drying process.

(Step 4a)

After the common gas nozzle 70A is moved toward the central portion of the wafer W and securely removes (discharges out) the cleaning liquid L remaining between the circuit patterns on the wafer W, the micro-level liquid droplets on the wafer W is scattered and dried by the centrifugal force while setting the rotation number of the wafer W to be, e.g., about 2000 rpm. Concurrently, the cleaning liquid nozzle 60 and the common gas nozzle 70A are returned back to the standby positions thereof.

The above-described Steps 1, 2, 3a and 4a are performed as the control computer 90 reads out the control program stored in the memory of the control computer 90 and outputs the control signal for operating each of the above-described components based on the read-out command.

(Third Illustrative Embodiment)

Figure 15:
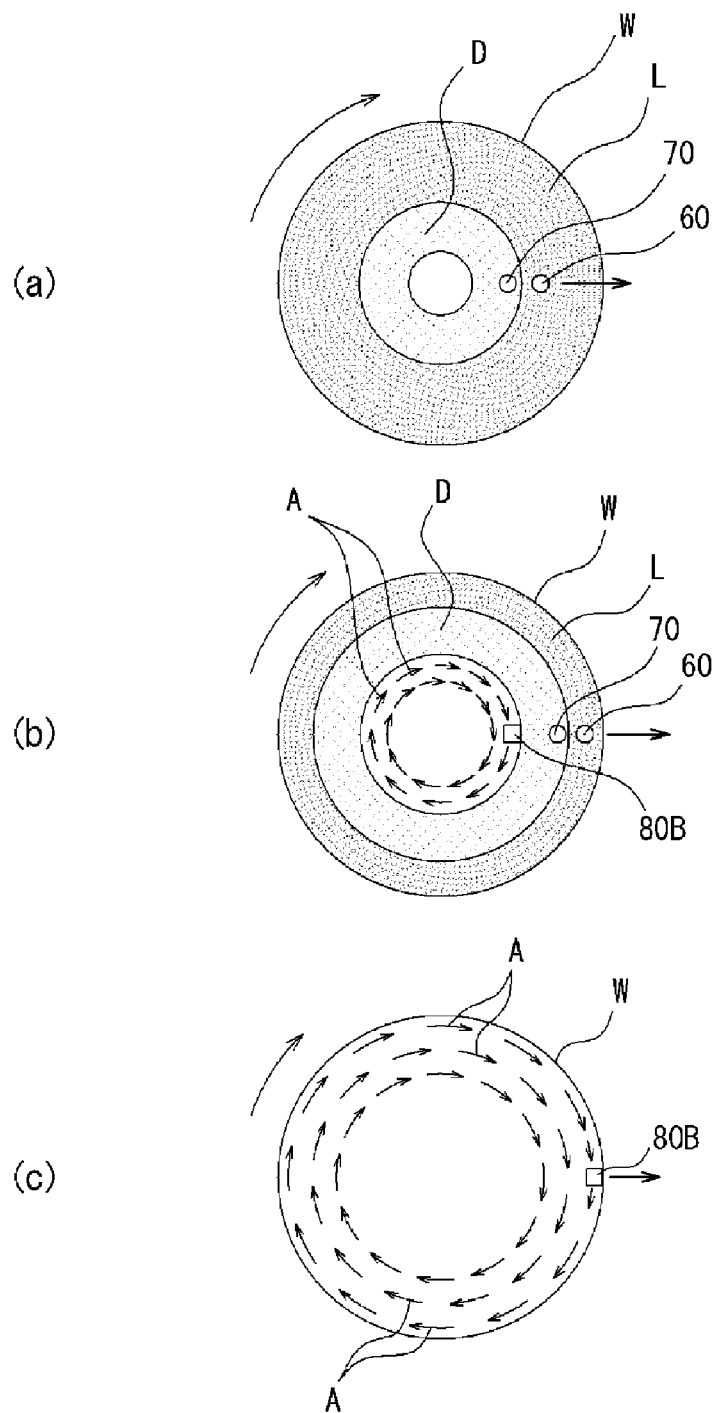
FIG. 15 is a schematic plane view illustrating a liquid film forming process, a first drying process and a second drying process in accordance with a third illustrative embodiment.
Figure 16:
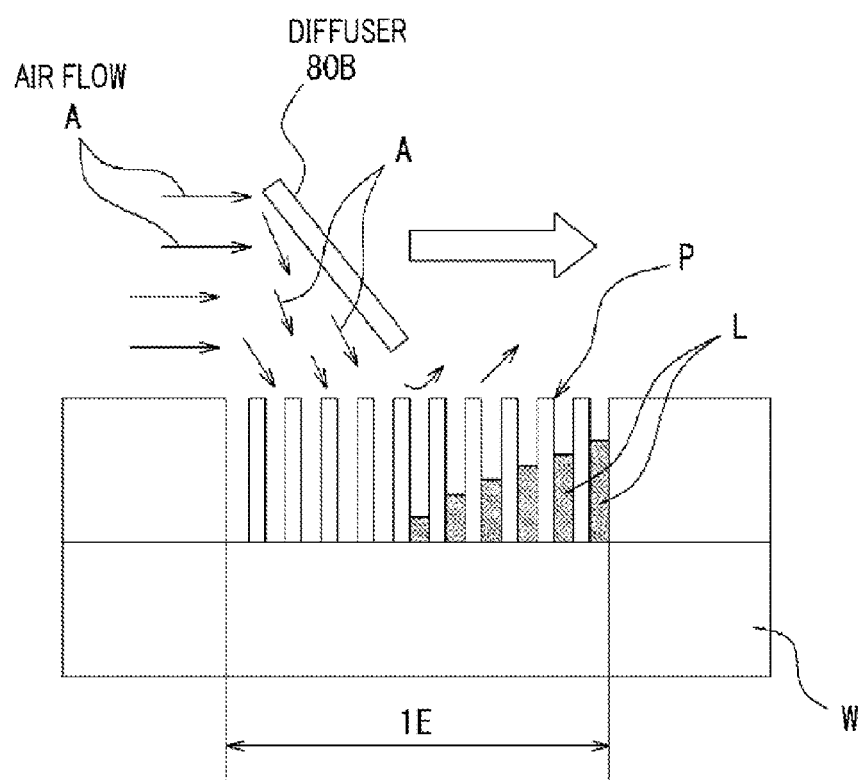
FIG. 16 is a schematic cross sectional view illustrating the second drying process in accordance with the third illustrative embodiment.

Now, a substrate cleaning apparatus and a substrate cleaning method in accordance with a third illustrative embodiment will be elaborate with reference to FIGS. 15 and 16. As depicted in FIG. 16, in the third illustrative embodiment, the residual liquid removing device is formed of a diffuser 80B serving as an air flow controller that guides and diffuses an air flow A generated by the rotation of the wafer W to the drying region D. Since the other configuration of the third illustrative embodiment except the diffuser 80B is the same as that of the first illustrative embodiment. Accordingly, same parts will be assigned same reference numerals and redundant description will be omitted.

In accordance with the third illustrative embodiment having the above-described configuration, by moving the diffuser 80B to the peripheral portion of the wafer W from the central portion thereof while rotating the wafer W, the air flow A generated by the rotation of the wafer W is guided and diffused to the drying region D. Thus, the cleaning liquid L remaining between the circuit patterns is removed.

The substrate cleaning method in accordance with the third illustrative embodiment having the above-described configuration will be briefly explained with reference to FIGS. 15 and 16. Since Steps 1 and 2 in the third illustrative embodiment are the same as those of the first illustrative embodiment, same parts will be assigned same reference numerals, and redundant description will be omitted.

(Step 3b)

As depicted in FIG. 15(*a*), the drying region D is formed on the entire surface of the wafer W by moving the cleaning liquid nozzle 60 and the first gas nozzle 70 from the central portion of the wafer W toward the peripheral portion thereof. Then, the diffuser 80B is moved from the central portion of the wafer W to the peripheral portion thereof while the wafer W is being rotated, and the air flow A generated by the rotation of the wafer W is guided and diffused to the drying region D by the diffuser 80B. As a result, the cleaning liquid L remaining between the circuit patterns is removed (see FIGS. 15(*b*) and 16). Further, the diffuser 80B is moved to the peripheral portion of the wafer W, so that the cleaning liquid L remaining between the circuit patterns is completely removed (discharged out).

(Step 4b)

After the diffuser 80B is moved to the peripheral portion of the wafer W and removes (discharges out) the cleaning liquid L remaining between the circuit patterns on the wafer W, the micro-level liquid droplets on the wafer W is scattered and dried by the centrifugal force while setting the rotation number of the wafer W to be, e.g., about 2000 rpm. Concurrently, the cleaning liquid nozzle 60, the first gas nozzle 70 and the diffuser 80B are returned back to the standby positions thereof.

The above-described Steps 1, 2, 3b and 4b are performed as the control computer 90 reads out the control program stored in the memory of the control computer 90 and outputs the control signal for operating each of the above-described components based on the read-out command.

(Fourth Illustrative Embodiment)

Figure 17:
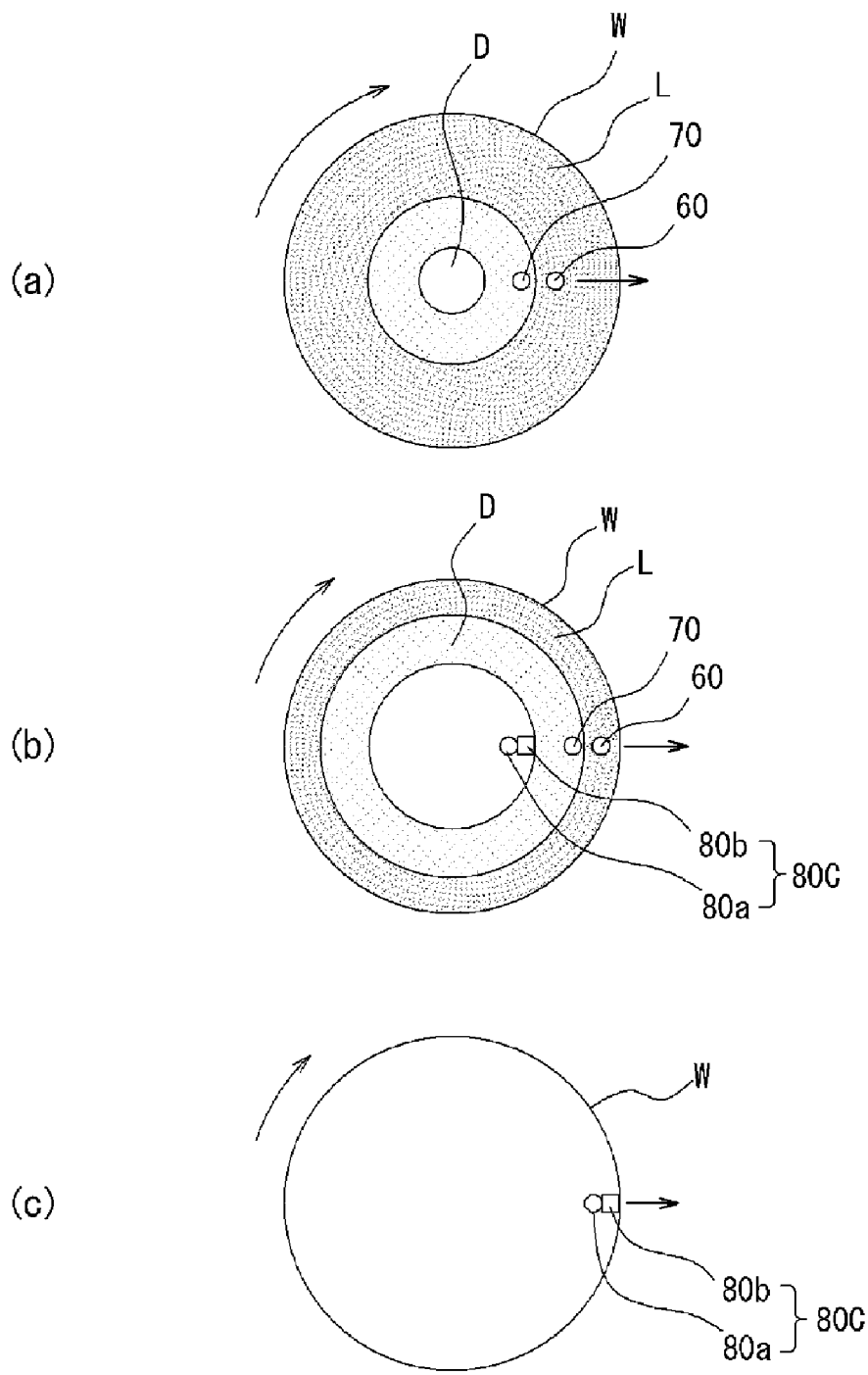
FIG. 17 is a schematic plane view illustrating a liquid film forming process, a first drying process and a second drying process in accordance with a fourth illustrative embodiment.
Figure 18:
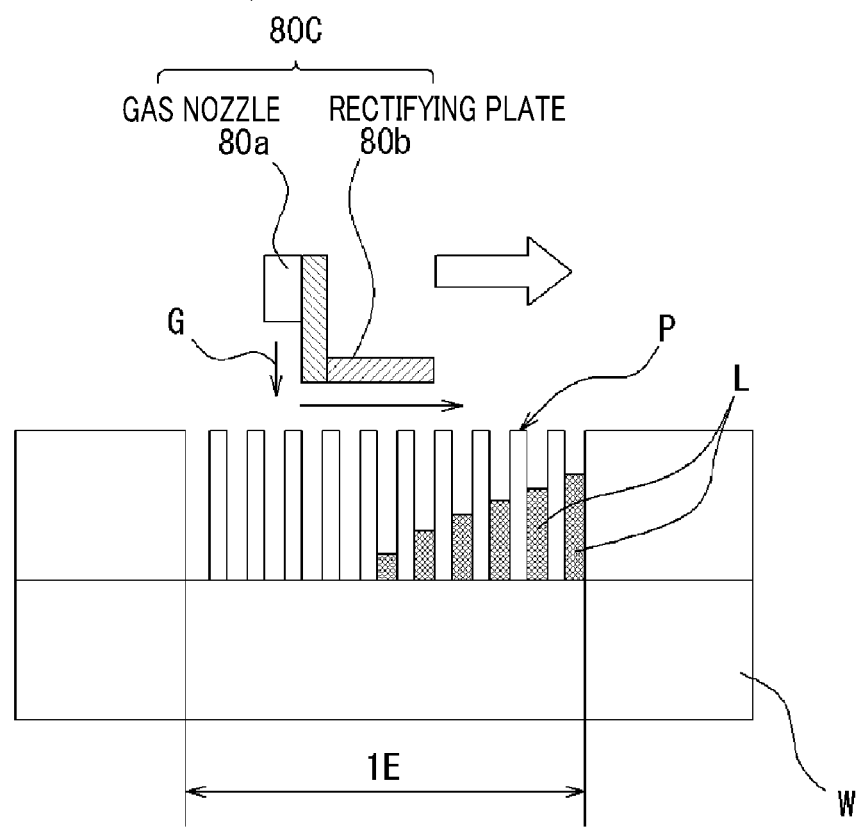
FIG. 18 is a schematic cross sectional view illustrating the second drying process in accordance with the fourth illustrative embodiment.

Now, a substrate cleaning apparatus and a substrate cleaning method in accordance with a fourth illustrative embodiment will be elaborated with reference to FIGS. 17 and 18. As depicted in FIG. 18, in accordance with the fourth illustrative embodiment, a residual liquid removing device 80C includes a gas nozzle 80a configured to discharge a gas onto the surface of the wafer W; and a rectifying plate 80b serving as an air flow controller that guides and diffuses the gas discharged from the gas nozzle 80a to the drying region D.

The other configurations of the fourth illustrative embodiment are the same as those of the first illustrative embodiment. Thus, same parts will be assigned same reference numerals, and redundant description will be omitted.

In accordance with the fourth illustrative embodiment having the above-described configuration, while rotating the wafer W, a gas, e.g., a $N_2$ gas G is discharged from the gas nozzle 80a to the peripheral portion of the wafer W from the central portion thereof. Further, by moving the rectifying plate 80b, the $N_2$ gas G discharged from the gas nozzle 80a is guided and diffused to the drying region D by the rectifying plate 80b. Thus, the cleaning liquid L remaining between the circuit patterns is removed.

The substrate cleaning method in accordance with the fourth illustrative embodiment having the above-described configuration will be briefly explained with reference to FIGS. 17 and 18. Since Steps 1 and 2 in the fourth illustrative embodiment are the same as those of the first illustrative embodiment, same parts will be assigned same reference numerals, and redundant description will be omitted.

(Step 3c)

As illustrated in FIG. 17(*a*), the drying region D is formed on the entire surface of the wafer W by moving the cleaning liquid nozzle 60 and the first gas nozzle 70 from the central portion of the wafer W toward the peripheral portion thereof. Then, while rotating the wafer W, a gas, e.g., a $N_2$ gas G is discharged from the gas nozzle 80a, and the rectifying plate 80b is moved from the central portion of the wafer W to the peripheral portion thereof. Accordingly, the $N_2$ gas G discharged from the gas nozzle 80a is guided and diffused to the drying region D by the rectifying plate 80b. As a result, the cleaning liquid L remaining between the circuit patterns is removed (see FIGS. 17(*b*) and 18). Further, the gas nozzle 80a and the rectifying plate 80b are moved to the peripheral portion of the wafer W, so that the cleaning liquid L remaining between the circuit patterns is completely removed (discharged out).

(Step 4c)

After the gas nozzle 80a and the rectifying plate 80b are moved to the peripheral portion of the wafer W and removes (discharges out) the cleaning liquid L remaining between the circuit patterns on the wafer W, the micro-level liquid droplets on the wafer W is scattered and dried by the centrifugal force while setting the rotation number of the wafer W to be, e.g., about 2000 rpm. Concurrently, the cleaning liquid nozzle 60, the first gas nozzle 70, the gas nozzle 80a and the rectifying plate 80b are returned back to the standby positions thereof.

The above-described Steps 1, 2, 3c and 4c are performed as the control computer 90 reads out the control program stored in the memory of the control computer 90 and outputs the control signal for operating each of the above-described components based on the read-out command.

(Fifth Illustrative Embodiment)

Figure 19:
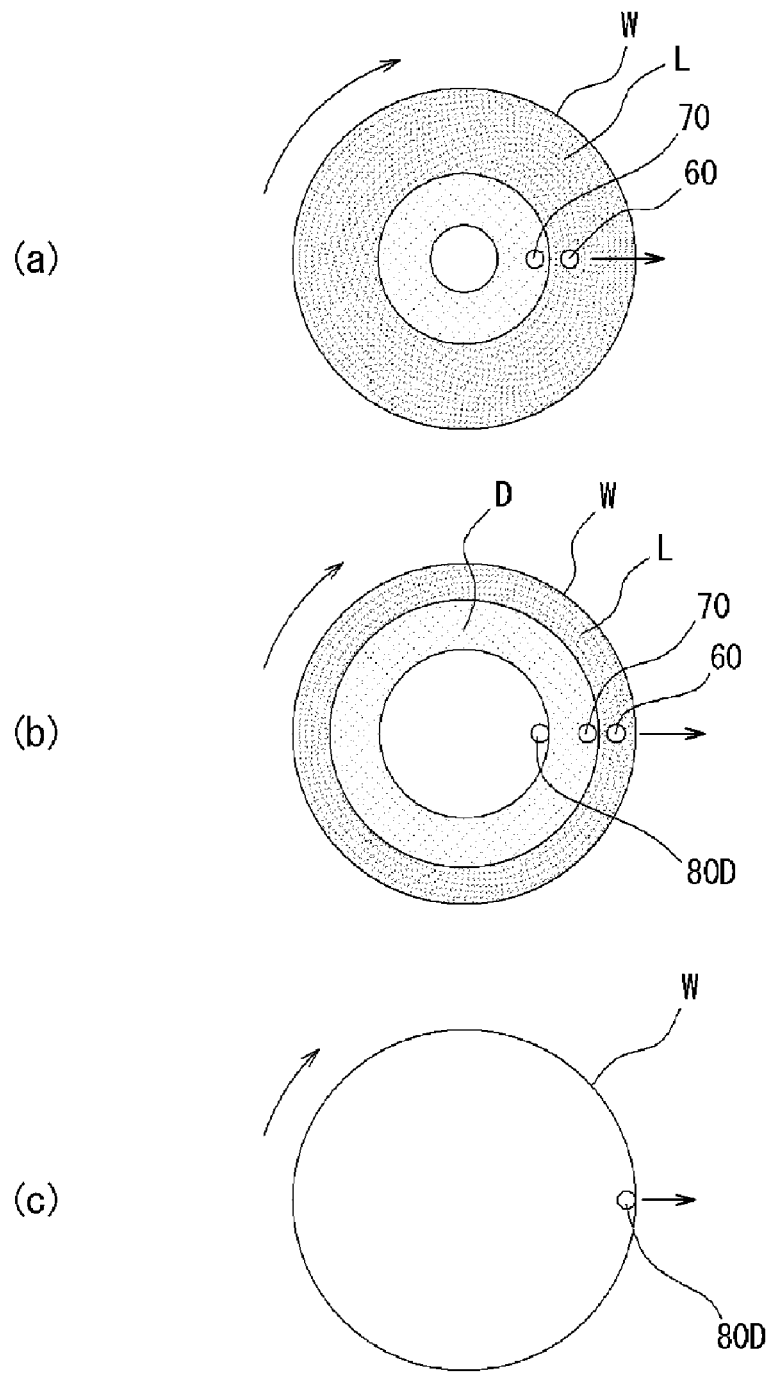
FIG. 19 is a schematic plane view illustrating a liquid film forming process, a first drying process and a second drying process in accordance with a fifth illustrative embodiment.
Figure 20:
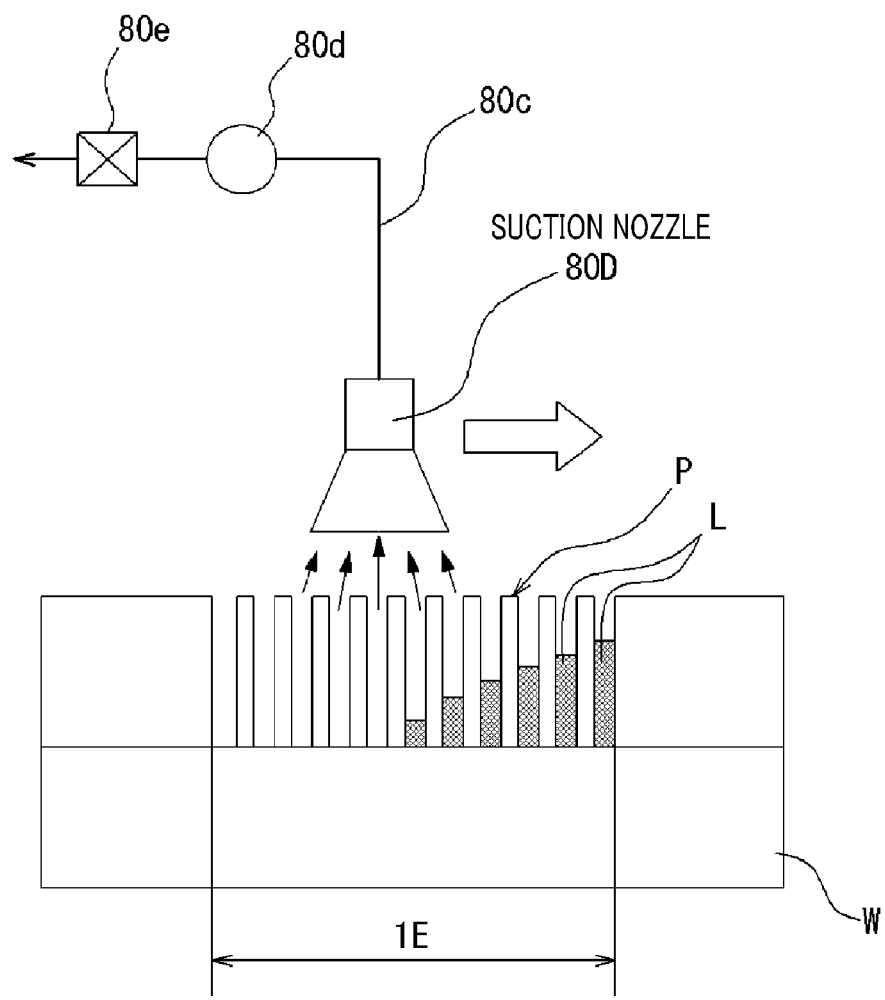
FIG. 20 is a schematic cross sectional view illustrating the second drying process in accordance with the fifth illustrative embodiment.

Now, a substrate cleaning apparatus and a substrate cleaning method in accordance with a fifth illustrative embodiment will be elaborated with reference to FIGS. 19 and 20. As depicted in FIG. 20, in accordance with the fifth illustrative embodiment, the residual liquid removing device is formed of a suction nozzle 80D configured to suction the cleaning liquid L remaining between the circuit patterns in the drying region D. In this case, the suction nozzle 80D may be connected to a suction device 80d such as a suction pump and a flow rate controller 80e via a suction line 80c. The other configuration of the fifth illustrative embodiment except the above is the same as that of the first illustrative embodiment. Thus, same parts will be assigned same reference numerals and redundant description will be omitted.

In accordance with the fifth illustrative embodiment having the above-described configuration, by moving the suction nozzle 80D from the central portion of the wafer W to the peripheral portion thereof while rotating the wafer W, the cleaning liquid L remaining between the circuit patterns in the drying region D can be suctioned and removed by a suctioning operation of the suction nozzle 80D.

The substrate cleaning method in accordance with the fifth illustrative embodiment having the above-described configuration will be briefly explained with reference to FIGS. 19 and 20. Since Steps 1 and 2 in the fifth illustrative embodiment are the same as those of the first illustrative embodiment, same parts will be assigned same reference numerals and redundant description will be omitted.

(Step 3d)

As illustrated in FIG. 19(a), the drying region D is formed on the entire surface of the wafer W by moving the cleaning liquid nozzle 60 and the first gas nozzle 70 from the central portion of the wafer W to the peripheral portion thereof. Then, while rotating the wafer W, the suction nozzle 80D is moved from the central portion of the wafer W to the peripheral portion thereof, so that the cleaning liquid L remaining between the circuit patterns in the drying region D is suctioned and removed by the suctioning operation of the suction nozzle 80D (see FIGS. 19(b) and 20). Further, the suction nozzle 80D is moved to the peripheral portion of the wafer W, so that the cleaning liquid L remaining between the circuit patterns on the wafer W is completely removed (discharged out).

(Step 4d)

After the suction nozzle 80D is moved to the peripheral portion of the wafer W and removes (discharges out) the cleaning liquid L remaining between the circuit patterns on the wafer W, the micro-level liquid droplets on the wafer W is scattered and dried by the centrifugal force while setting the rotation number of the wafer W to be, e.g., about 2000 rpm. Concurrently, the cleaning liquid nozzle 60, the first gas nozzle 70 and the suction nozzle 80D are returned back to the standby positions thereof.

The above-described Steps 1, 2, 3d and 4d are performed as the control computer 90 reads out the control program stored in the memory of the control computer 90 and outputs the control signal for operating each of the above-described components based on the read-out command.

(Sixth Illustrative Embodiment)

Figure 21:
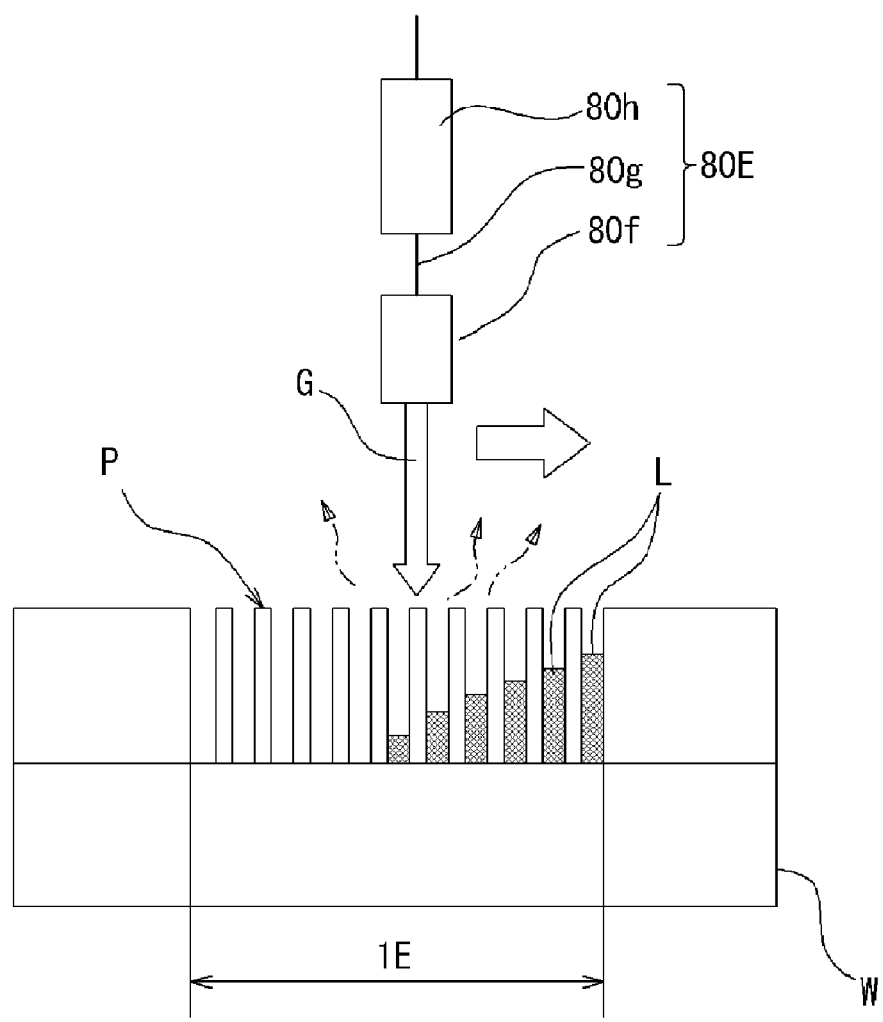
FIG. 21 is a schematic cross sectional view illustrating a second drying process in accordance with a sixth illustrative embodiment.

Now, a substrate cleaning apparatus and a substrate cleaning method in accordance with a sixth illustrative embodiment will be explained with reference to FIG. 21. As depicted in FIG. 21, in accordance with the sixth illustrative embodiment, a residual liquid removing device 80E includes a gas nozzle 80f configured to discharge a gas to the surface of the wafer W; and a heater 80h serving as a heating member provided on a gas supply line 80g of the gas nozzle 80f and configured to heat the gas supplied to the gas nozzle 80f, e.g., a $N_2$ gas G, to, e.g., about 40° C. The other configuration of the sixth illustrative embodiment except the above is the same as that of the first illustrative embodiment. Thus, same parts will be assigned same reference numerals, and redundant description will be omitted.

In accordance with the sixth illustrative embodiment having the above-described configuration, by discharging from the gas nozzle 80f the $N_2$ gas G heated by the heater 80h onto the surface of the wafer W from the central portion of the wafer W to the peripheral portion thereof while rotating the wafer W, the cleaning liquid L remaining between the circuit patterns in the drying region D can be dried and removed.

Further, the substrate cleaning method in accordance with the sixth illustrative embodiment is the same as the substrate cleaning method in accordance with the first illustrative embodiment excepting that the heated $N_2$ gas G is discharged to the surface of the wafer W from the gas nozzle 80f. Thus, redundant description will be omitted here.

(Seventh Illustrative Embodiment)

Figure 22:
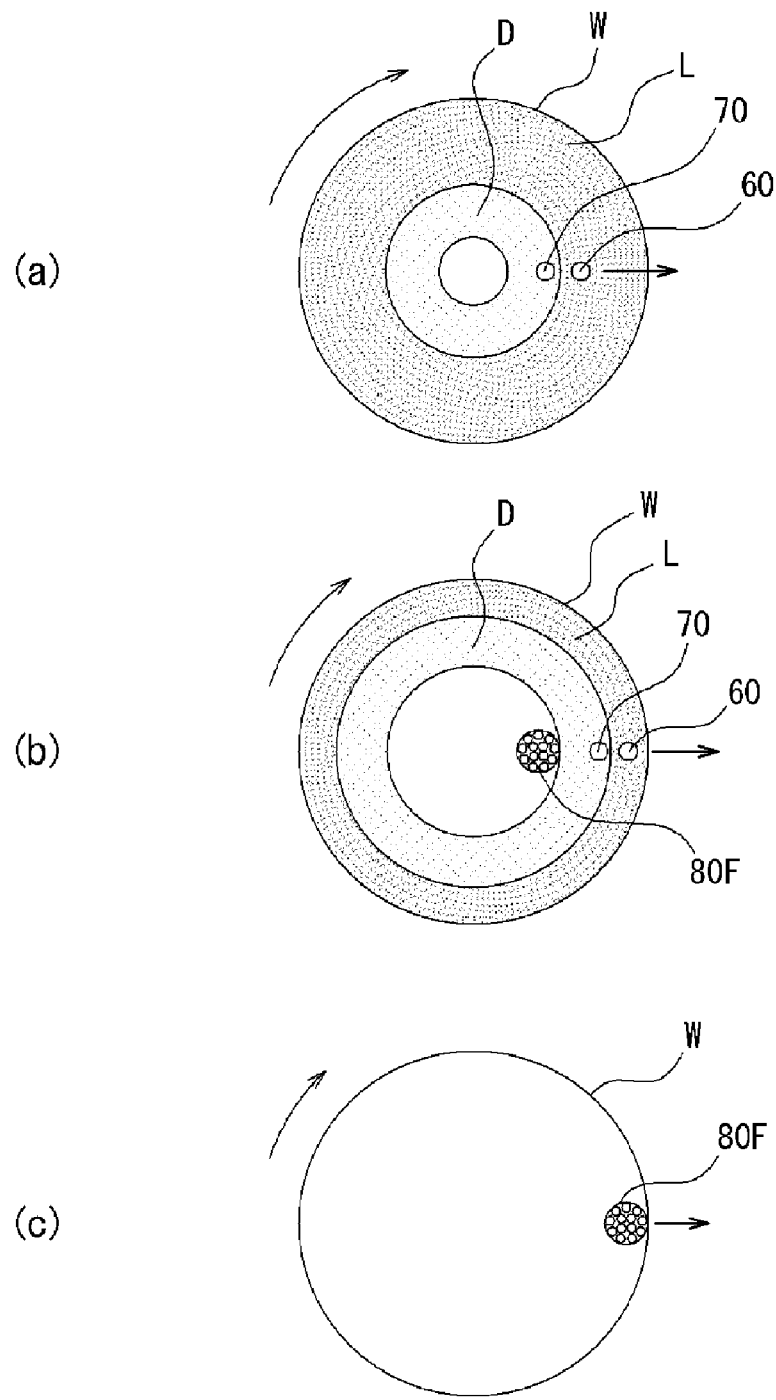
FIG. 22 is a schematic plane view illustrating a liquid film forming process, a first drying process and a second drying process in accordance with a seventh illustrative embodiment.
Figure 23:
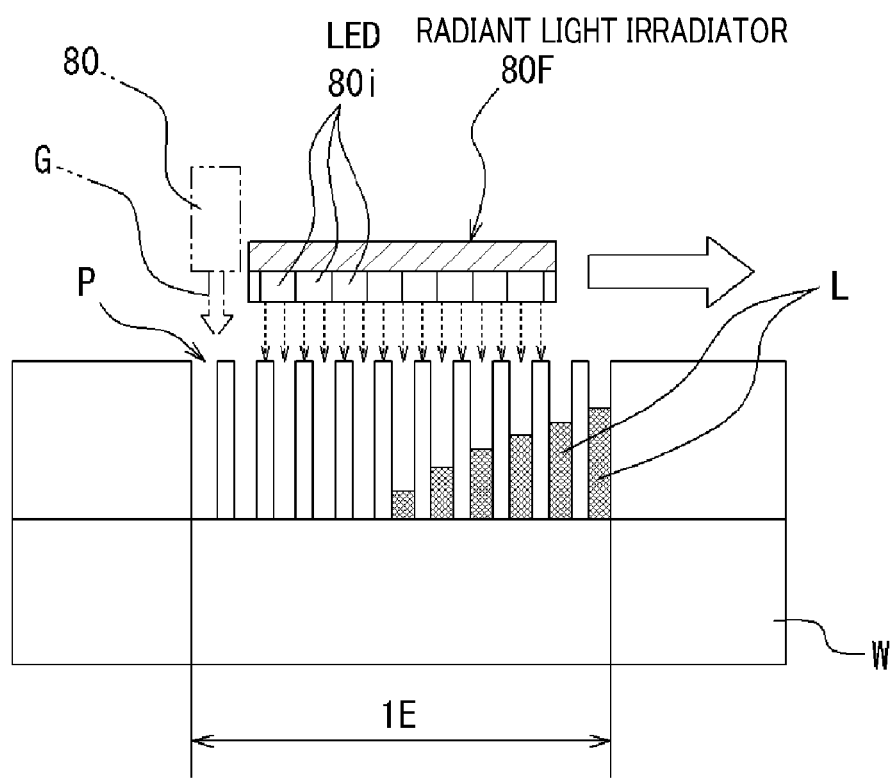
FIG. 23 is a schematic cross sectional view illustrating the second drying process in accordance with the seventh illustrative embodiment.

Now, a substrate cleaning apparatus and a substrate cleaning method in accordance with a seventh illustrative embodiment will be explained with reference to FIGS. 22 and 23. As illustrated in FIG. 23, in accordance with the seventh illustrative embodiment, the residual liquid removing device is formed of a heating member, e.g., a radiant light irradiator 80F configured to irradiate radiant heat on the surface of the wafer W to dry and remove the cleaning liquid L remaining between the circuit patterns. In this case, the radiant light irradiator 80F includes a multiple number of light emitting diodes 80i (hereinafter, referred to as "LED 80i"). The other configuration of the seventh illustrative embodiment except the above is the same as that of the first illustrative embodiment. Thus, same parts will be assigned same reference numerals and redundant description will be omitted.

In accordance with the seventh illustrative embodiment, while rotating the wafer W, the radiant light irradiator 80F is moved from the central portion of the wafer W to the peripheral thereof. Accordingly, the cleaning liquid L remaining between the circuit patterns in the drying region D can be dried and removed by irradiating the radiant heat from the LEDs 80i of the radiant light irradiator 80F.

The substrate cleaning method in accordance with the seventh illustrative embodiment having the above-described configuration will be briefly explained with reference to FIGS. 22 and 23. Since Steps 1 and 2 in the seventh illustrative embodiment are the same as those of the first illustrative embodiment, same parts will be assigned same reference numerals, and redundant description will be omitted.

(Step 3e)

As shown in FIG. 22(a), the drying region D is formed on the entire surface of the wafer W by moving the cleaning liquid nozzle 60 and the first gas nozzle 70 from the central portion of the wafer W to the peripheral portion thereof. Then, while rotating the wafer W, the radiant light irradiator 80F is moved from the central portion of the wafer W to the peripheral portion thereof, so that the cleaning liquid L remaining between the circuit patterns in the drying region D is dried and removed by irradiating the radiant light from the LEDs 80i of the radiant light irradiator 80F (see FIGS. 22(b) and 23).

(Step 4e)

After the radiant light irradiator 80F is moved to the peripheral portion of the wafer W and removes (discharges out) the cleaning liquid L remaining between the circuit patterns on the wafer W, the micro-level liquid droplets on the wafer W is scattered and dried by the centrifugal force while setting the rotation number of the wafer W to be, e.g., about 2000 rpm. Concurrently, the cleaning liquid nozzle 60, the first gas nozzle 70 and the radiant light irradiator 80F are returned back to the standby positions thereof.

The above-described Steps 1, 2, 3e and 4e are performed as the control computer 90 reads out the control program stored in the memory of the control computer 90 and outputs the control signal for operating each of the above-described components based on the read-out command.

(Eighth Illustrative Embodiment)

Figure 24:
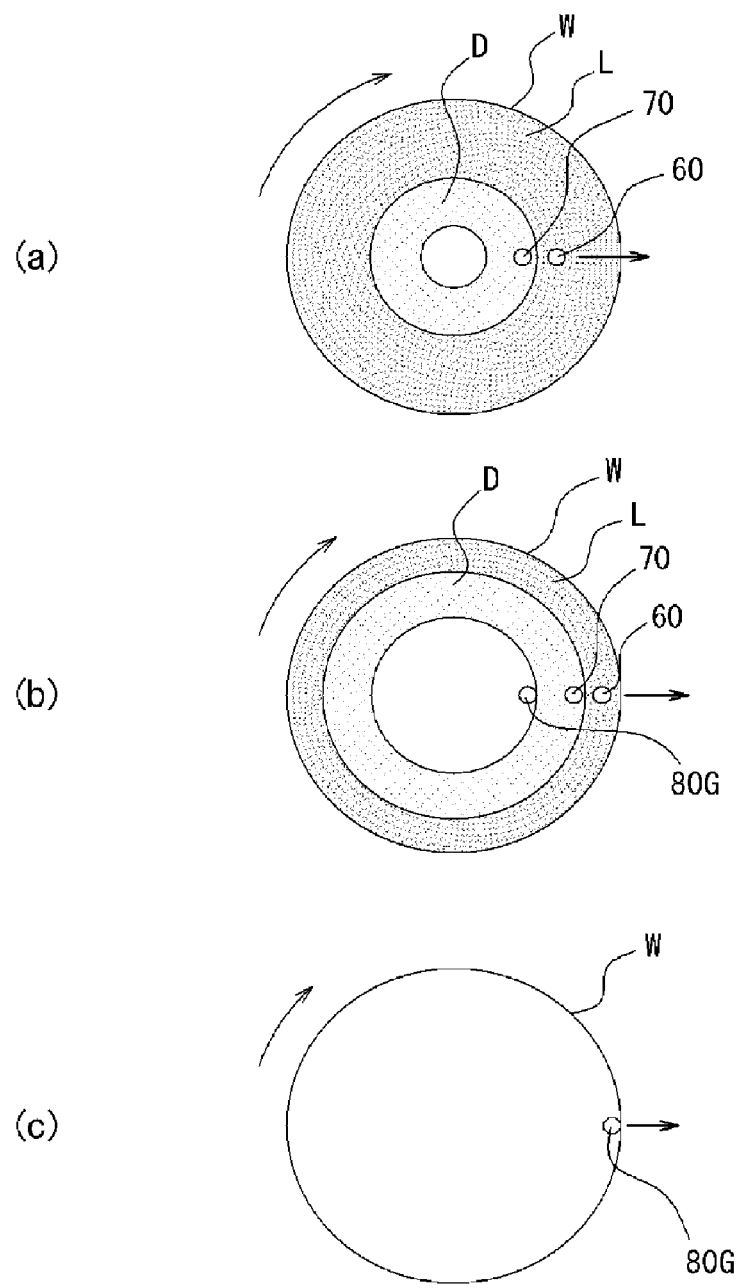
FIG. 24 is a schematic plane view illustrating a liquid film forming process, a first drying process and a second drying process in accordance with an eighth illustrative embodiment.
Figure 25:
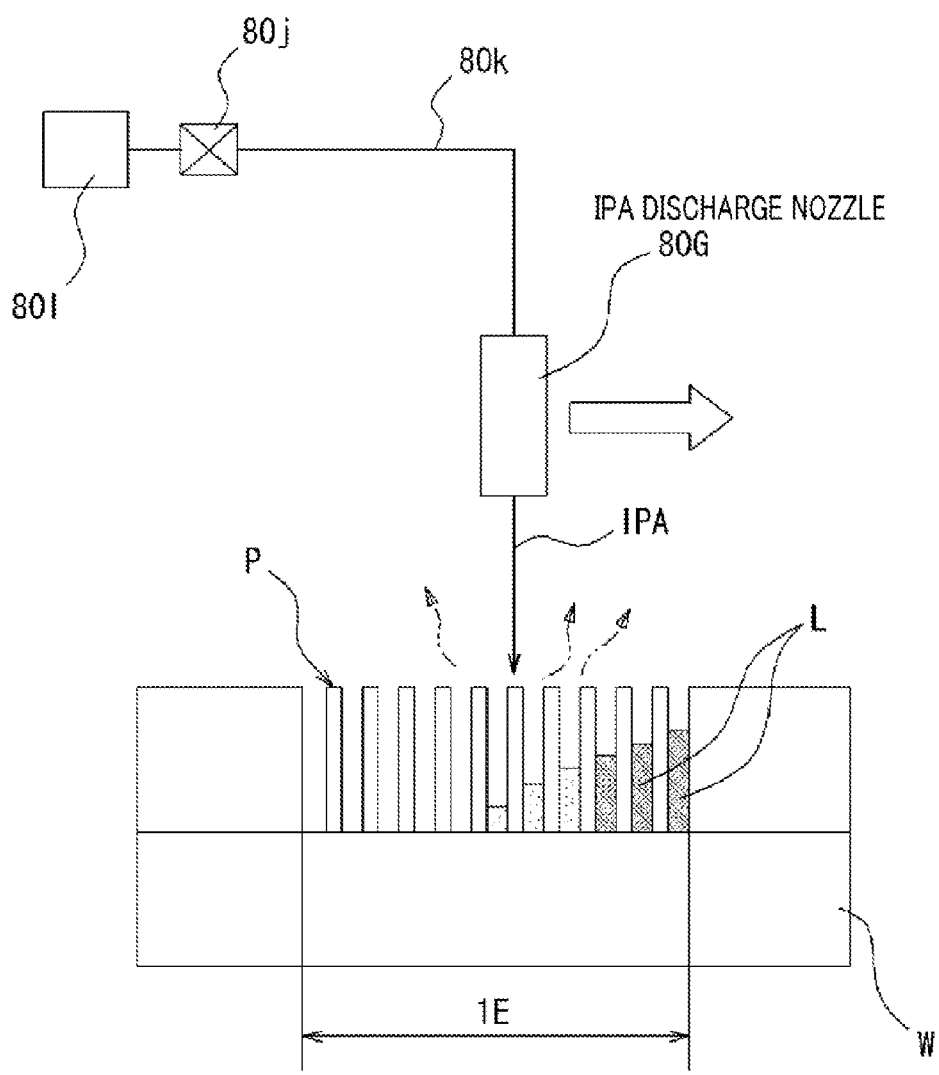
FIG. 25 is a schematic cross sectional view illustrating the second drying process in accordance with the eighth illustrative embodiment.

A substrate cleaning apparatus and a substrate cleaning method in accordance with an eighth illustrative embodiment will be explained with reference to FIGS. 24 and 25. As depicted in FIG. 25, in accordance with the eighth illustrative embodiment, the residual liquid removing device is formed of an organic solvent discharge nozzle 80G (hereinafter, referred to as "IPA discharge nozzle 80G") configured to discharge an organic solvent having high volatility, e.g., isopropyl alcohol (IPA) on the surface of the wafer W. In this case, the IPA discharge nozzle 80G may be connected to an IPA supply source 80I via an IPA supply line 80k on which a flow rate controller 80j is provided. The other configuration of the eighth illustrative embodiment except the above is the same as that of the first illustrative embodiment. Thus, same parts will be assigned same reference numerals and redundant description will be omitted.

In accordance with the eighth illustrative embodiment having the above-described configuration, while rotating the wafer W, the IPA discharge nozzle 80G is moved from the central portion of the wafer W to the peripheral portion thereof. Accordingly, the cleaning liquid L remaining between the circuit patterns in the drying region D is substituted with IPA discharged from the IPA discharge nozzle 80G. As a result, the cleaning liquid L can be more rapidly dried and removed.

The substrate cleaning method in accordance with the eighth illustrative embodiment having the above-described configuration will be briefly explained with reference to FIGS. 24 and 25. Since Steps 1 and 2 in the eighth illustrative embodiment are the same as those of the first illustrative embodiment, same parts will be assigned same reference numerals and redundant description will be omitted.

(Step 3f)

As shown in FIG. 24(a), the drying region D is formed on the entire surface of the wafer W by moving the cleaning liquid nozzle 60 and the first gas nozzle 70 from the central portion of the wafer W to the peripheral portion thereof. Then, while rotating the wafer W the IPA discharge nozzle 80G is moved from the central portion of the wafer W to the peripheral portion thereof, so that the cleaning liquid L remaining between the circuit patterns in the drying region D is dried and removed by being substituted with the IPA discharged from the IPA discharge nozzle 80G (see FIGS. 24(b) and 25). Further, the IPA discharge nozzle 80G is moved to the peripheral portion of the wafer W. Thus, the cleaning liquid L remaining between the circuit patterns is completely removed (discharged out).

(Step 4f)

After the IPA discharge nozzle 80G is moved to the peripheral portion of the wafer W and removes (discharges out) the cleaning liquid L remaining between the circuit patterns on the wafer W, the micro-level liquid droplets on the wafer W is scattered and dried by the centrifugal force while setting the rotation number of the wafer W to be, e.g., about 2000 rpm. Concurrently, the cleaning liquid nozzle 60, the first gas nozzle 70 and the IPA discharge nozzle 80G are returned back to the standby positions thereof.

The above-described Steps 1, 2, 3f and 4f are performed as the control computer 90 reads out the control program stored in the memory of the control computer 90 and outputs the control signal for operating each of the above-described components based on the read-out command.

(Ninth Illustrative Embodiment)

Figure 26:
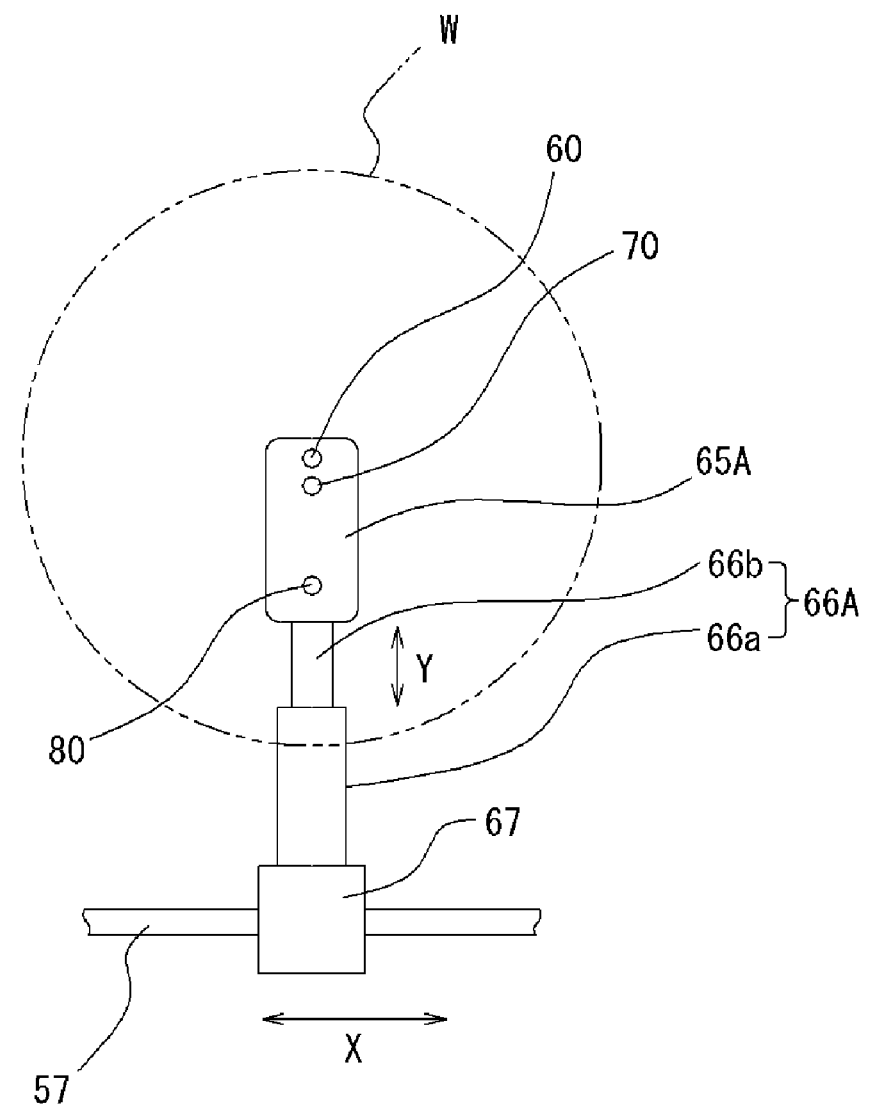
FIG. 26 is a schematic plane view illustrating a cleaning liquid nozzle, a first gas nozzle and a second gas nozzle in accordance with a ninth illustrative embodiment.
Figure 27:
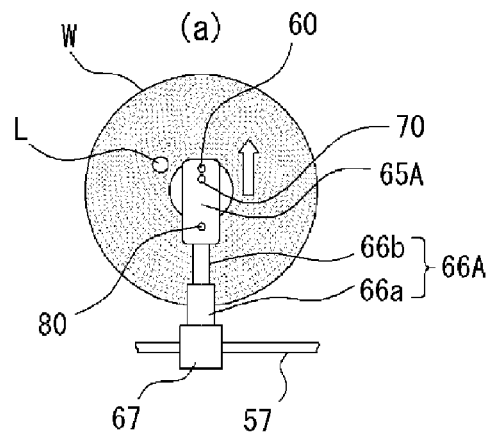
FIG. 27 is a schematic plane view illustrating a liquid film forming process, a first drying process and a second drying process in accordance with the ninth illustrative embodiment.
Figure 27:
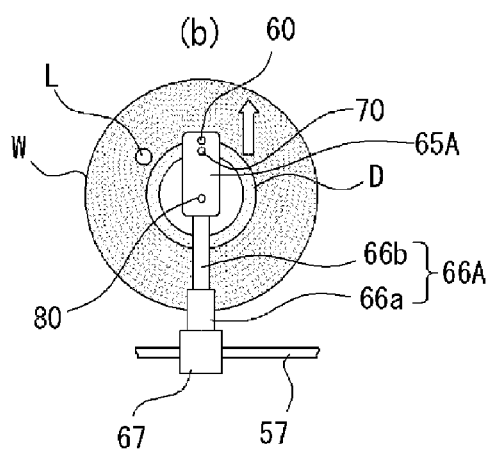
Figure 27:
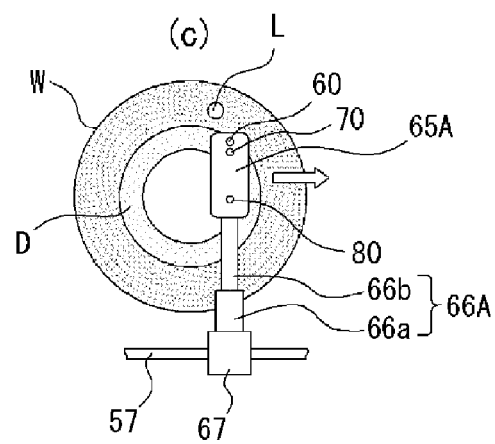
Figure 28:
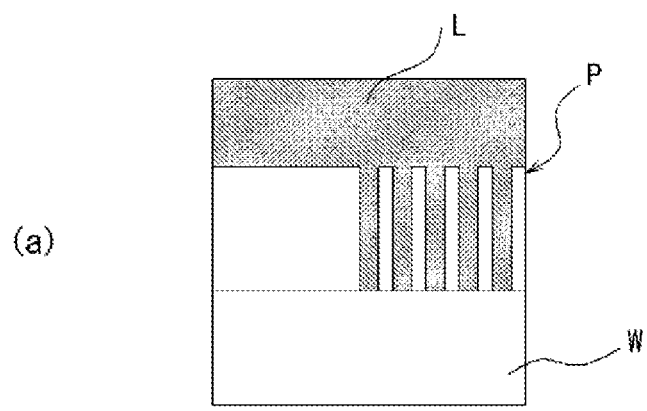
FIG. 28 provides a schematic cross sectional view (a) illustrating a liquid film forming state on a circuit pattern in a substrate cleaning process, a schematic cross sectional view (b) illustrating a state where liquid droplets remain on the circuit pattern after the liquid film is formed thereon, and a schematic cross sectional view (c) illustrating a dried state after forming the liquid film.
Figure 28:
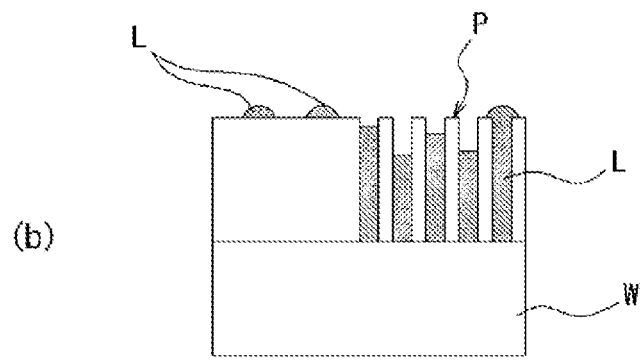
Figure 28:
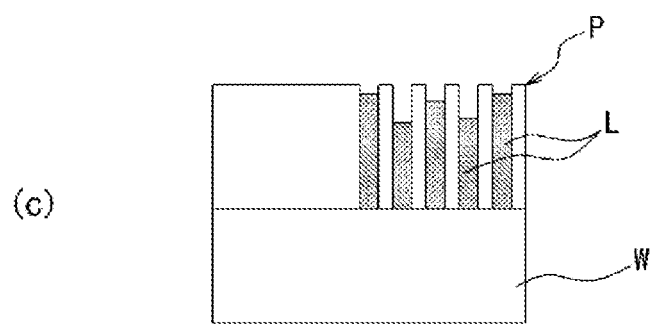
Figure 29:
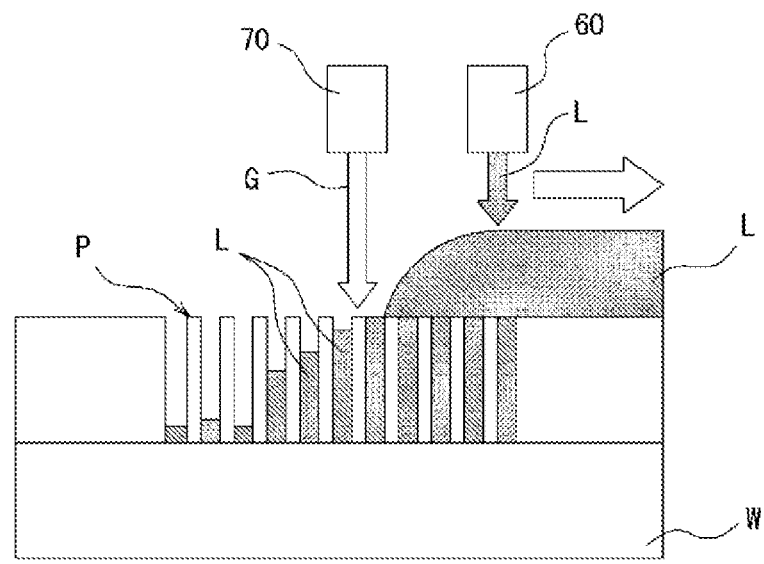
FIG. 29 provides a schematic cross sectional view (a) illustrating a liquid film forming process and a drying process in a conventional substrate cleaning process and an enlarged schematic cross sectional view (b) illustrating pattern damage caused by a liquid remaining between circuit patterns after the drying process.
Figure 29:
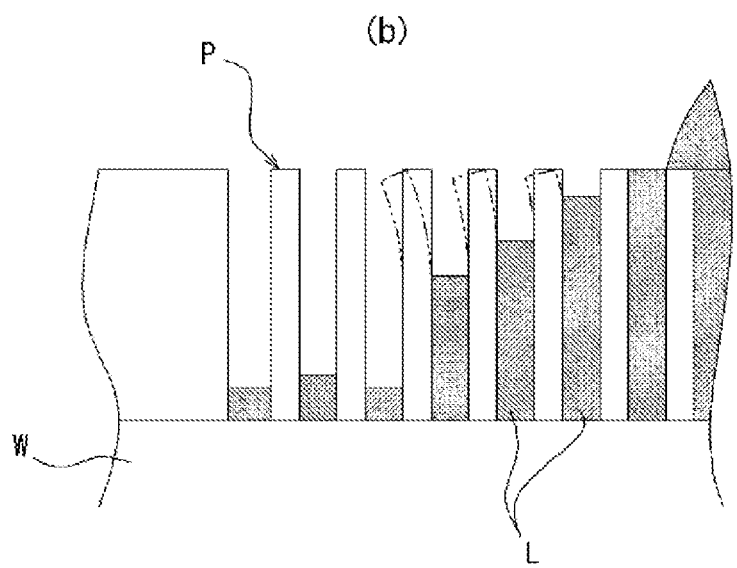

Now, a substrate cleaning apparatus and a substrate cleaning method in accordance with a ninth illustrative embodiment will be explained with reference to FIGS. 26 and 27. As depicted in FIG. 26, in accordance with the ninth illustrative embodiment, the residual liquid removing device is formed of the second gas nozzle 80. This second gas nozzle 80 along with the cleaning liquid nozzle 60 and the first gas nozzle 70 is provided at a nozzle holder 65A. The nozzle holder 65A is connected to a leading end of a nozzle arm 66A which is extensible and contractible in a Y direction. Further, the nozzle arm 66A is fixed to the movable base 67 capable of being moved in the transversal direction (X direction) along the guide member 57 provided in the X direction. In this ninth illustrative embodiment, the cleaning liquid nozzle 60 and the first gas nozzle 70 may be provided at a leading end of the nozzle holder 65A in the extending/contracting direction (Y direction), and the second gas nozzle 80 is provided at a base end of the nozzle holder 65A. Further, the nozzle arm 66A includes a cylinder member 66a fixed to the movable base 67; and a rod member 66b configured to be extensible and contractible with respect to the cylinder member 66a. The other configuration of the ninth illustrative embodiment except the above is the same as that of the first illustrative embodiment. Thus, same parts will be assigned same reference numerals, and redundant description will be omitted.

In accordance with the ninth illustrative embodiment having the above-described configuration, while rotating the wafer W, the second gas nozzle 80 is moved from the central portion of the wafer W to the peripheral portion thereof. Accordingly, the cleaning liquid L remaining between the circuit patterns in the drying region D can be removed by, e.g., a $N_2$ gas G discharged from the second gas nozzle 80.

The substrate cleaning method in accordance with the ninth illustrative embodiment having the above-described configuration will be briefly explained with reference to FIGS. 26 and 27. Since Steps 1 and 2 in the ninth illustrative embodiment are the same as those of the first illustrative embodiment excepting that the cleaning liquid nozzle 60 and the first gas nozzle 70 are moved in the Y direction, same parts will be assigned same reference numerals, and redundant description will be omitted.

(Step 3g)

As shown in FIGS. 27(a) and 27(b), the drying region D is formed on the entire surface of the wafer W by moving the cleaning liquid nozzle 60 and the first gas nozzle 70 from the central portion of the wafer W to the peripheral portion thereof in the Y direction. Then, the second gas nozzle 80 is moved from the central portion of the wafer W to the peripheral portion thereof in the X direction while rotating the wafer W. Accordingly, the cleaning liquid L remaining between the circuit patterns in the drying region D is removed by the $N_2$ gas G discharged from the second gas nozzle 80 (see FIG. 27(c)). Further, the second gas nozzle 80 is moved to the peripheral portion of the wafer W. Thus, the cleaning liquid L remaining between the circuit patterns is completely removed (discharged out).

(Step 4g)

After the second gas nozzle 80 is moved to the peripheral portion of the wafer W and removes (discharges out) the cleaning liquid L remaining between the circuit patterns on the wafer W, the micro-level liquid droplets on the wafer W is scattered and dried by the centrifugal force while setting the rotation number of the wafer W to be, e.g., about 2000 rpm. Concurrently, the cleaning liquid nozzle 60, the first gas nozzle 70 and the second gas nozzle 80 are returned back to the standby positions thereof.

The above-described Steps 1, 2, 3g and 4g are performed as the control computer 90 reads out the control program stored in the memory of the control computer 90 and outputs the control signal for operating each of the above-described components based on the read-out command.

(Other Illustrative Embodiments)

While various aspects and embodiments have been described herein, other aspects and embodiments will be apparent to those skilled in the art. The various aspects and embodiments disclosed herein are for the purposes of illustration and are not intended to be limiting. Therefore, the true scope of the disclosure is indicated by the appended claims rather than by the foregoing description, and it shall be understood that all modifications and embodiments conceived from the meaning and scope of the claims and their equivalents are included in the scope of the disclosure.

By way of example, in the third to the eighth illustrative embodiments, the cleaning liquid L remaining between the circuit patterns is removed by moving the residual liquid removing devices 80B to 80G in the same direction as the moving direction of the cleaning liquid nozzle 60 and the first gas nozzle 70 from the central portion of the wafer W to the peripheral portion thereof. However, the residual liquid removing devices 80B to 80G need not necessarily be moved in the same direction as the moving direction of the cleaning liquid nozzle 60 and the first gas nozzle 70. As depicted by the dashed double-dotted line in the first illustrative embodiment, the residual liquid removing devices 80B to 80G may be moved in the opposite direction to the moving direction of the cleaning liquid nozzle 60 and the first gas nozzle 70 to remove the cleaning liquid L remaining between the circuit patterns.

Further, in the above-described illustrative embodiments, the cleaning liquid nozzle 60 and the first gas nozzle 70 are provided at the common nozzle arm 66 as one body. However, the cleaning liquid nozzle 60 and the first gas nozzle 70 may be provided at individual nozzle arms, respectively. With this configuration, since the first gas nozzle 70 is located above the surface of the wafer W only when the first gas nozzle 70 discharges the $N_2$ gas, it is possible to prevent the mist of the cleaning liquid L or the like from adhering to the first gas nozzle 70 to be condensed.

Moreover, in the above-described illustrative embodiments, the cleaning liquid nozzle 60, the first gas nozzle 70 and the second gas nozzle 80 are provided at the common nozzle arm 66 as one body. However, the cleaning liquid nozzle 60, the first gas nozzle 70 and the second gas nozzle 80 may be provided at individual nozzle arms, respectively. In this configuration, it is required that the second gas nozzle 80 is disposed apart from the first gas nozzle 70 by a distance no smaller than the unit exposure region E for forming the circuit patterns P (see FIG. 5).

In addition, in the seventh illustrative embodiment as described above, the cleaning liquid L remaining between the circuit patterns in the drying region D is dried and removed by irradiating the radiant light from the LEDs 80i of the radiant light irradiator 80F. As depicted in by a dashed double-dotted line in FIG. 23, however, it may be also possible to additionally provide the second gas nozzle 80 at the radiant light irradiator 80F. With this configuration, the cleaning liquid L remaining between the circuit patterns may be dried and removed by the $N_2$ gas discharged from the second gas nozzle 80 as well as by the radiant light irradiated from the LEDs 80i of the radiant light irradiator 80F. Accordingly, cleaning efficiency can be further improved.

The illustrative embodiments may also be applicable to a glass substrate for a flat panel display in addition to a silicon wafer.

What is claimed is:

1. A substrate cleaning method for cleaning a surface of a substrate on which circuit patterns are formed, the substrate cleaning method comprising:

a liquid film forming process that forms a liquid film on an entire surface of the substrate by supplying a cleaning liquid from a central portion of the substrate toward a peripheral portion thereof while horizontally holding the substrate and rotating the substrate about a central axis of the substrate;

a first drying process that forms a drying region by discharging a gas from a gas nozzle onto the surface of the substrate from the central portion of the substrate toward the peripheral portion thereof after supplying the cleaning liquid and by removing the cleaning liquid on the surface of the substrate, while rotating the substrate; and a second drying process that removes the cleaning liquid remaining between the circuit patterns in the drying region after the first drying process by a residual liquid removing device that moves in a diametrical direction of the substrate independently from the gas nozzle, while rotating the substrate, wherein a residual liquid removing position of the residual liquid removing device in the second drying process is located to be spaced apart from a gas discharge position in the first drying process by a distance no smaller than a unit exposure region for forming the circuit patterns in order to suppress non-uniform distribution of the cleaning liquid remaining between the circuit patterns, and said unit exposure region is a region to which light is irradiated through one time exposure by an exposure apparatus.

2. The substrate cleaning method of claim 1, wherein in the first drying process, a moving speed of a gas discharge position is set to be equal to or larger than a preset value in order to suppress non-uniform distribution of the cleaning liquid remaining between the circuit patterns.

3. The substrate cleaning method of claim 1, wherein as a supply position of the cleaning liquid approaches the peripheral portion of the substrate, a rotation number of the substrate is reduced in order to control a linear velocity at the supply position of the cleaning liquid to be equal to or smaller than a predetermined value.

4. The substrate cleaning method of claim 1,
wherein between an end of the first drying process and a start of the second drying process, a product of a centrifugal force and a rotation time of the substrate is controlled at each of positions on the substrate in order to prevent damage of the circuit patterns.

5. The substrate cleaning method of claim 1,
wherein in the second drying process, the cleaning liquid remaining between the circuit patterns is removed by moving the residual liquid removing device from the central portion of the substrate to the peripheral portion thereof.

6. The substrate cleaning method of claim 1,
wherein in the second drying process, the cleaning liquid remaining between the circuit patterns is removed by moving the residual liquid removing device from the peripheral portion of the substrate toward the central portion thereof.

7. The substrate cleaning method of claim 1,
wherein in the second drying process, the cleaning liquid remaining between the circuit patterns is removed by discharging a gas onto the surface of the substrate.

8. The substrate cleaning method of claim 1,
wherein in the second drying process, the cleaning liquid remaining between the circuit patterns is removed by guiding and diffusing an air flow generated by rotating the substrate to the drying region through an air flow controller.

9. The substrate cleaning method of claim 1,
wherein in the second drying process, the cleaning liquid remaining between the circuit patterns is removed by being suctioned.

10. The substrate cleaning method of claim 1,
wherein in the second drying process, the cleaning liquid remaining between the circuit patterns is dried and removed by being heated.

11. The substrate cleaning method of claim 1,
wherein in the second drying process, the cleaning liquid remaining between the circuit patterns is removed by discharging an organic solvent onto the surface of the substrate and substituting the cleaning liquid between the circuit patterns with the organic solvent.

12. A computer-readable storage medium having stored thereon computer-executable instructions, in response to execution, causes a substrate cleaning apparatus to perform a substrate cleaning method as claimed in claim 1,
wherein the substrate cleaning apparatus is configured to clean a surface of a substrate on which circuit patterns are formed.

13. A substrate cleaning apparatus for cleaning a surface of a substrate on which circuit patterns are formed, the substrate cleaning apparatus comprising:
a substrate holder configured to hold thereon the substrate such that a central portion of the substrate is coincident with a rotation axis of the substrate holder;
a rotating device configured to rotate the substrate holder about the rotation axis thereof;
a cleaning liquid nozzle configured to supply a cleaning liquid onto the surface of the substrate held on the substrate holder;
a gas nozzle configured to discharge a gas onto the surface of the substrate held on the substrate holder;
a residual liquid removing device configured to remove the cleaning liquid remaining between the circuit patterns formed on the surface of the substrate held on the substrate holder;
a moving device configured to move the cleaning liquid nozzle, the gas nozzle and the residual liquid removing device; and
a controller configured to control the rotating device, the cleaning liquid nozzle, the gas nozzle, the residual liquid removing device and the moving device,
wherein, in response to a control signal from the controller, while rotating the substrate, the cleaning liquid is supplied from the cleaning liquid nozzle onto the surface of the substrate while the cleaning liquid nozzle is moved from the central portion of the substrate toward a peripheral portion thereof, and a liquid film is formed on an entire surface of the substrate;
after supplying the cleaning liquid, the gas is discharged from the gas nozzle onto the surface of the substrate while the gas nozzle is moved from the central portion of the substrate toward the peripheral portion thereof, and the cleaning liquid on the surface of the substrate is removed to form a drying region; and
the cleaning liquid remaining between the circuit patterns in the drying region is removed by moving the residual liquid removing device in a diametrical direction of the substrate independently from the gas nozzle,
wherein a residual liquid removing position of the residual liquid removing device is located to be spaced apart from a gas discharge position in the first drying process by a distance no smaller than a unit exposure region for forming the circuit patterns in order to suppress non-uniform distribution of the cleaning liquid remaining between the circuit patterns, and
said unit exposure region is a region to which light is irradiated through one time exposure by an exposure apparatus.

14. The substrate cleaning apparatus of claim 13,
wherein the residual liquid removing device is formed of a gas nozzle configured to discharge a gas onto the surface of the substrate.

15. The substrate cleaning apparatus of claim 13,
wherein the residual liquid removing device is formed of an air flow controller configured to guide and diffuse an air flow generated by the rotation of the substrate to the drying region.

16. The substrate cleaning apparatus of claim 13,
wherein the residual liquid removing device is formed of a suction nozzle configured to suck the cleaning liquid remaining between the circuit patterns.

17. The substrate cleaning apparatus of claim 13,
wherein the residual liquid removing device is formed of a heating member configured to dry and remove the cleaning liquid remaining between the circuit patterns by irradiating radiant heat to the surface of the substrate.

18. The substrate cleaning apparatus of claim 13,
wherein the residual liquid removing device is formed of an organic solvent discharge nozzle configured to discharge an organic solvent onto the surface of the substrate.

* * * * *